United States Patent
Ho et al.

(10) Patent No.: US 10,747,695 B2
(45) Date of Patent: Aug. 18, 2020

(54) METHODS OF PERFORMING MULTIPLE DATA BUS INVERSION (DBI) AND MEMORY DEVICES PERFORMING THE METHODS

(71) Applicant: Samsung Electronics Co., Ltd., Suwon-si, Gyeonggi-do (KR)

(72) Inventors: Byung-Kyu Ho, Incheon (KR); Jae-Woong Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 232 days.

(21) Appl. No.: 15/969,797

(22) Filed: May 3, 2018

(65) Prior Publication Data

US 2019/0129877 A1 May 2, 2019

(30) Foreign Application Priority Data

Oct. 27, 2017 (KR) .......................... 10-2017-0141318

(51) Int. Cl.
| | |
|---|---|
| *G11C 7/10* | (2006.01) |
| *H04L 25/49* | (2006.01) |
| *G06F 13/36* | (2006.01) |
| *G06F 9/445* | (2018.01) |

(52) U.S. Cl.
CPC .......... *G06F 13/36* (2013.01); *G06F 9/44505* (2013.01); *G11C 7/1006* (2013.01); *H04L 25/4915* (2013.01)

(58) Field of Classification Search
CPC .......................... G11C 7/1006; H04L 25/4915
See application file for complete search history.

(56) References Cited

U.S. PATENT DOCUMENTS

| | | | |
|---|---|---|---|
| 7,501,963 B1 | 3/2009 | Hollis | |
| 8,260,992 B2 * | 9/2012 | Dearth | ............... G06F 13/4234 |
| | | | 710/117 |
| 8,495,437 B2 | 7/2013 | Sohn et al. | |
| 8,606,982 B2 | 12/2013 | Maldei et al. | |
| 8,862,811 B2 | 10/2014 | Shido et al. | |
| 9,058,436 B1 | 6/2015 | Chiu et al. | |
| 9,244,875 B1 | 1/2016 | Loke et al. | |
| 9,252,802 B2 | 2/2016 | Hollis | |
| 9,405,721 B2 | 8/2016 | Ayyapureddi et al. | |

(Continued)

FOREIGN PATENT DOCUMENTS

KR   10-1653468   9/2016

*Primary Examiner* — Zachary K Huson
(74) *Attorney, Agent, or Firm* — Myers Bigel, P.A.

(57) ABSTRACT

A method of performing multiple data bus inversion (DBI) and a memory device performing the method are provided. The multiple DBI includes first through third DBI operations, wherein the first DBI operation determines whether to perform data inversion on a first data inversion group in which M×N data bits of a M×N data bit structure are grouped and performs the data inversion on the first data inversion group, the second DBI operation determines whether to perform data inversion on second data inversion groups formed by grouping M data bits from among the M×N data bits and performs the data inversion on the second data inversion groups, and the third DBI operation determines whether to perform data inversion on third data inversion groups formed by grouping N data bits from among the M×N data bits and performs the data inversion on the third data inversion groups.

20 Claims, 38 Drawing Sheets

(56) References Cited

U.S. PATENT DOCUMENTS

2013/0061102 A1* 3/2013 Sohn .................... G11C 7/1006
 714/718
2016/0364348 A1 12/2016 Shu

* cited by examiner

FIG. 2

DBI

| DQ0 | DQ8  | DQ16 | DQ24 | DQ32 | DQ40 | DQ48 | DQ56 |
|-----|------|------|------|------|------|------|------|
| DQ1 | DQ9  | DQ17 | DQ25 | DQ33 | DQ41 | DQ49 | DQ57 |
| DQ2 | DQ10 | DQ18 | DQ26 | DQ34 | DQ42 | DQ50 | DQ58 |
| DQ3 | DQ11 | DQ19 | DQ27 | DQ35 | DQ43 | DQ51 | DQ59 |
| DQ4 | DQ12 | DQ20 | DQ28 | DQ36 | DQ44 | DQ52 | DQ60 |
| DQ5 | DQ13 | DQ21 | DQ29 | DQ37 | DQ45 | DQ53 | DQ61 |
| DQ6 | DQ14 | DQ22 | DQ30 | DQ38 | DQ46 | DQ54 | DQ62 |
| DQ7 | DQ15 | DQ23 | DQ31 | DQ39 | DQ47 | DQ55 | DQ63 |

| DBI0 | DBI1 | DBI2 | DBI3 | DBI4 | DBI5 | DBI6 | DBI7 |

FIG. 3

Multiple DBI

| DQ0 | DQ8  | DQ16 | DQ24 | DQ32 | DQ40 | DQ48 | DQ56 | DBI_H0 |
|-----|------|------|------|------|------|------|------|--------|
| DQ1 | DQ9  | DQ17 | DQ25 | DQ33 | DQ41 | DQ49 | DQ57 | DBI_H1 |
| DQ2 | DQ10 | DQ18 | DQ26 | DQ34 | DQ42 | DQ50 | DQ58 | DBI_H2 |
| DQ3 | DQ11 | DQ19 | DQ27 | DQ35 | DQ43 | DQ51 | DQ59 | DBI_H3 |
| DQ4 | DQ12 | DQ20 | DQ28 | DQ36 | DQ44 | DQ52 | DQ60 | DBI_H4 |
| DQ5 | DQ13 | DQ21 | DQ29 | DQ37 | DQ45 | DQ53 | DQ61 | DBI_H5 |
| DQ6 | DQ14 | DQ22 | DQ30 | DQ38 | DQ46 | DQ54 | DQ62 | DBI_H6 |
| DQ7 | DQ15 | DQ23 | DQ31 | DQ39 | DQ47 | DQ55 | DQ63 | DBI_H7 |

| DBI_V0 | DBI_V1 | DBI_V2 | DBI_V3 | DBI_V4 | DBI_V5 | DBI_V6 | DBI_V7 | DBI_ALL |

FIG. 5A

Original

| 0 | : No Transition
| 1 | : Transition of 1 : 32

DBI of 1 : 32

FIG. 6A

Original

| 0 | : No Transition
| 1 | : Transition

| 1 | 1 | 1 | 1 | 1 | 1 | 1 | 1 |
| 1 | 1 | 1 | 1 | 1 | 1 | 1 | 1 |
| 1 | 1 | 1 | 1 | 1 | 1 | 1 | 1 |
| 1 | 1 | 1 | 1 | 1 | 1 | 1 | 1 |
| 1 | 1 | 1 | 1 | 1 | 1 | 1 | 1 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

\# of 1 : 40

DBI

| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 1 | 1 | 1 | 1 | 1 | 1 | 1 | 1 |
| 1 | 1 | 1 | 1 | 1 | 1 | 1 | 1 |
| 1 | 1 | 1 | 1 | 1 | 1 | 1 | 1 |

| 1 | 1 | 1 | 1 | 1 | 1 | 1 | 1 |

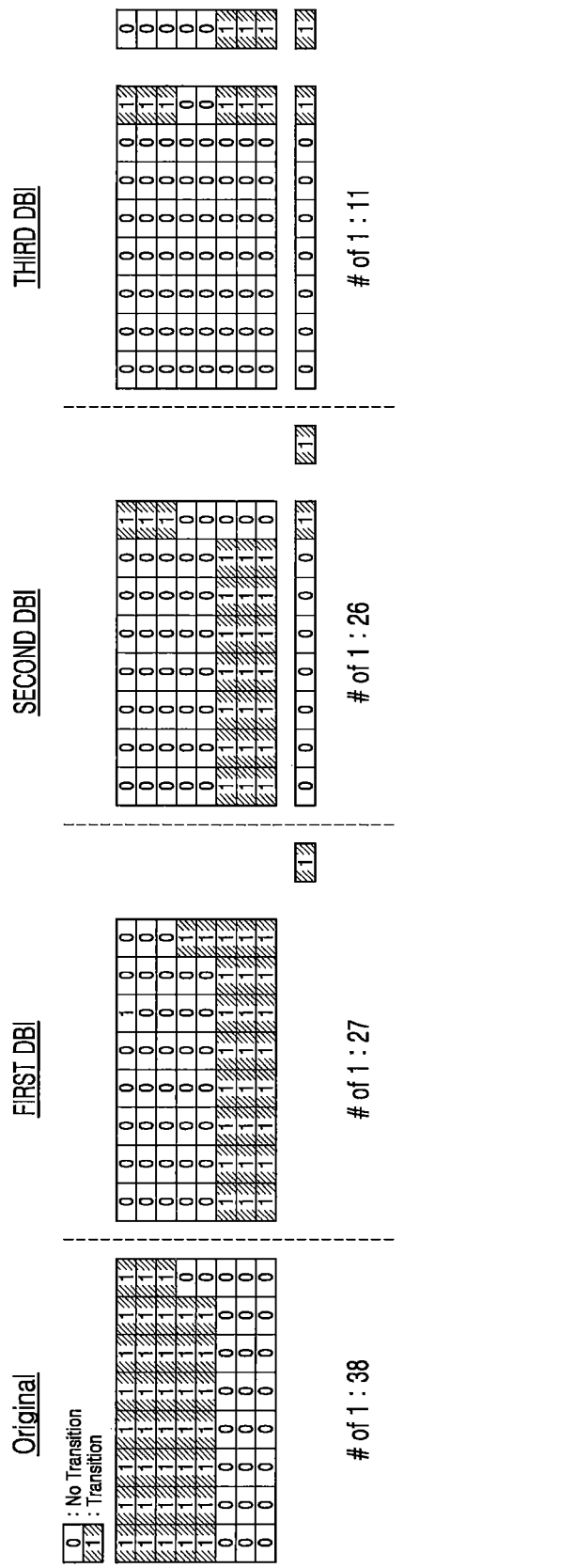

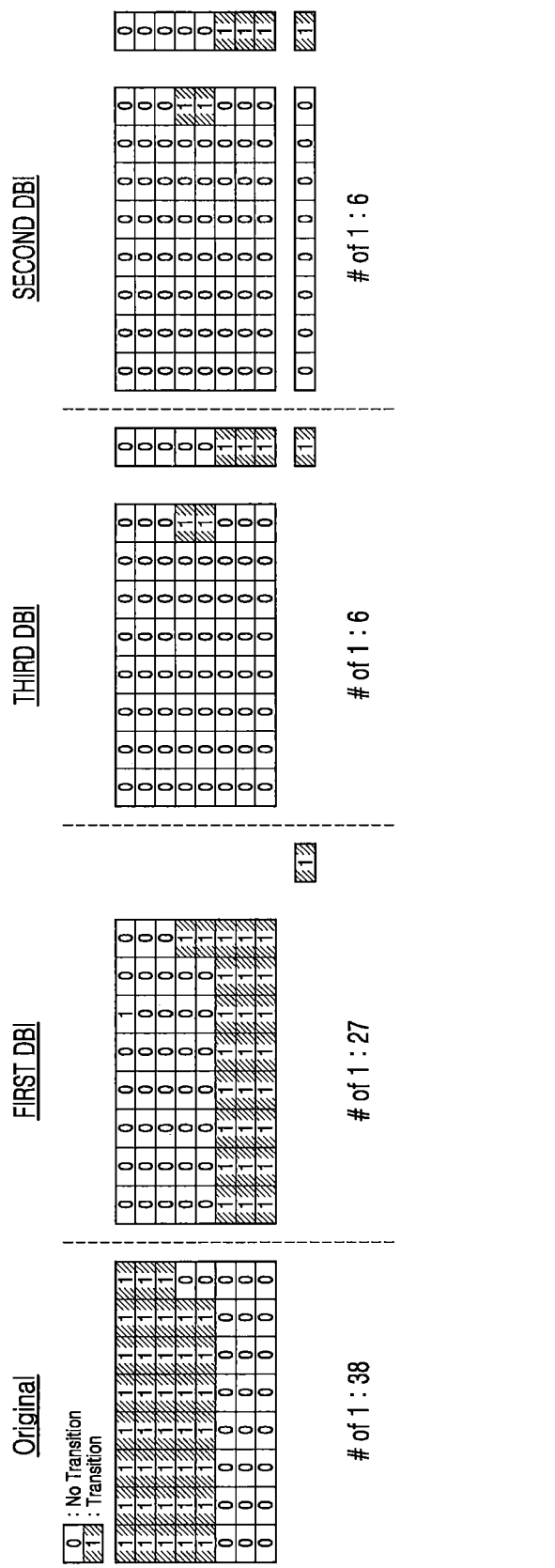

FIG. 10A

Original

| 0 | : No Transition |
| 1 | : Transition | of 1: 38

DBI of 1: 7

FIG. 12A

Original | DBI

0 : No Transition
1 : Transition of 1 : 32    # of 1 : 32

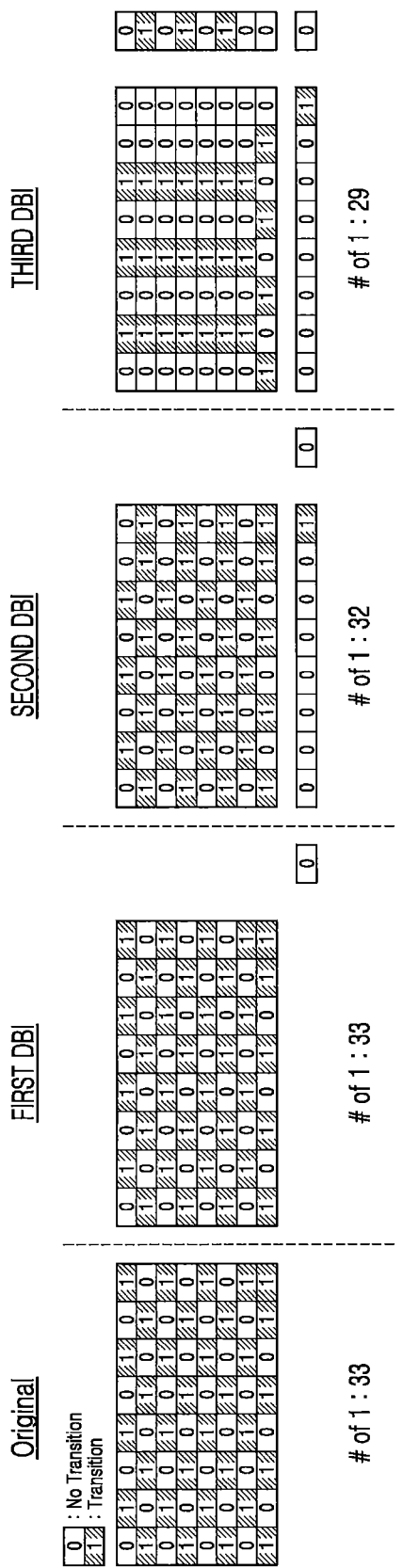

FIG. 20A

| DQ0 | DQ4 | DQ8 | DQ12 |  | DBI_H0 |
|---|---|---|---|---|---|
| DQ1 | DQ5 | DQ9 | DQ13 |  | DBI_H1 |
| DQ2 | DQ6 | DQ10 | DQ14 |  | DBI_H2 |
| DQ3 | DQ7 | DQ11 | DQ15 |  | DBI_H3 |

| DBI_V0 | DBI_V1 | DBI_V2 | DBI_V3 |  | DBI_ALL |
|---|---|---|---|---|---|

METHODS OF PERFORMING MULTIPLE DATA BUS INVERSION (DBI) AND MEMORY DEVICES PERFORMING THE METHODS

CROSS-REFERENCE TO RELATED APPLICATION

This application claims the benefit of Korean Patent Application No. 10-2017-0141318, filed on Oct. 27, 2017, in the Korean Intellectual Property Office, the disclosure of which is incorporated by reference herein in its entirety.

TECHNICAL FIELD

The inventive concepts relate to semiconductor memory devices, and more particularly, to methods of performing a multiple data bus inversion (DBI) operation, and memory devices performing the methods.

BACKGROUND

Data transmission among integrated circuit (IC) devices is performed through data signals that are driven by parallel channels of a data bus, the data signals being so-called data bits. The data bits may be sensitive to cross talk, simultaneous switching noise (SSN), inter-symbol interference (ISI), and/or power consumption, based on states of data or frequencies of data transition. In order to reduce these adverse effects, a data encoding method, such as data bus inversion (DBI), may be used. According to DBI, first, relationships between the data bits transmitted through the data bus are assessed, and then, before transmission of the data bits, it is determined whether it is effective to invert part or all of the data bits. When the data bits are inverted, an additional signal, that is, a DBI bit, which indicates that the data bits are inverted, may be set.

In order to support various systems, such as graphics, servers, super computers, networks, etc., for which high performance and low power consumption are required, high-bandwidth memory (HBM) can be provided, which is configured to provide wide input and output operations based on a multi-channel interface. The HBM may perform DBI in units of bytes in a channel including a plurality of data bits. Generally, DBI is performed when the number of data bits that are transitioned during data transmission is greater than half of all the data bits. When the DBI is applied, power consumption reduction, signal integrity (SI) improvement, heating reduction, etc., may be expected. In order to increase/maximize these effects, new DBI capable of reducing/minimizing the number of data transitions with respect to multiple-bit wide data, such as in HBM, may be desirable.

SUMMARY

The inventive concepts provide methods of performing multiple data bus inversion (DBI) with respect to multiple-bit wide data, and memory devices configured to perform the methods.

According to aspects of the inventive concepts, a memory device is provided. The memory device may be configured to perform multiple data bus inversion (DBI), and the memory device may include a channel configured to transmit multiple-bit wide data including M×N data bits (where M and N are natural numbers), and an inversion logic unit configured to perform selectively a first DBI operation on a first data inversion group in which the M×N data bits are grouped and configured to perform selectively a second DBI operation on second data inversion groups in which M data bits from among the M×N data bits are grouped, based on a first value of each of the M×N data bits.

According to aspects of the inventive concepts, a method of performing, based on a first value of each of M×N data bits, multiple data bus inversion (DBI) on multiple-bit wide data including an M×N data bit structure (where M and N are natural numbers) is provided. The method may include forming a first data inversion group by grouping the M×N data bits of the M×N data bit structure, forming second data inversion groups by grouping the M×N data bit structure by M data bits in a first direction, determining whether to perform data inversion on the first data inversion group and performing the data inversion on the first data inversion group, response to a first DBI signal, and determining whether to perform data inversion on the second data inversion groups and performing the data inversion on the second data inversion groups, in response to second DBI signals respectively corresponding to the second data inversion groups.

According to other aspects of the inventive concepts, a method of performing, based on a first value of each of M×N data bits, multiple data bus inversion (DBI) on multiple-bit wide data including an M×N data bit structure is provided. The method may include forming a first data inversion group by grouping the M×N data bits, forming second data inversion groups by assembling M data bits from among the M×N data bits in the M×N data bit structure and grouping the assembled M data bits, determining whether to perform data inversion on the first data inversion group and performing the data inversion on the first data inversion group, in response to a first DBI signal, and determining whether to perform data inversion on the second data inversion groups and performing the data inversion on the second data inversion groups, in response to second DBI signals respectively corresponding to the second data inversion groups.

BRIEF DESCRIPTION OF THE DRAWINGS

Aspects of the present disclosure will be more clearly understood from the following detailed description taken in conjunction with the accompanying drawings in which:

FIG. 2 is a diagram for describing a general data bus inversion (DBI) operation;

FIG. 3 is a diagram for describing a multiple DBI operation with respect to multiple-bit wide data, according to aspects of the present disclosure;

FIGS. 5A and 5B are diagrams for describing a method of performing multiple DBI, according to aspects of the present disclosure;

FIGS. 6A and 6B are diagrams for describing a method of performing multiple DBI, according to aspects of the present disclosure;

FIGS. 9A through 9C are diagrams for describing a method of performing multiple DBI, according to an embodiment;

FIGS. 10A through 10C are diagrams for describing a method of performing multiple DBI, according to aspects of the present disclosure;

FIGS. 12A and 12B are diagrams for describing a method of performing multiple DBI, according to aspects of the present disclosure;

FIGS. 13A and 13B are diagrams for describing a method of performing multiple DBI, according to aspects of the present disclosure;

FIGS. 15A and 15B are diagrams for describing a method of performing multiple DBI, according to aspects of the present disclosure;

FIGS. 17A and 17B are diagrams for describing a method of performing multiple DBI, according to aspects of the present disclosure;

FIGS. 18A and 18B are diagrams for describing a method of performing multiple DBI, according to aspects of the present disclosure;

FIGS. 19A and 19B are diagrams for describing a method of performing multiple DBI, according to aspects of the present disclosure;

FIGS. 20A and 20B are diagrams for describing a method of performing multiple DBI, according to aspects of the present disclosure;

DETAILED DESCRIPTION

Figure 1:
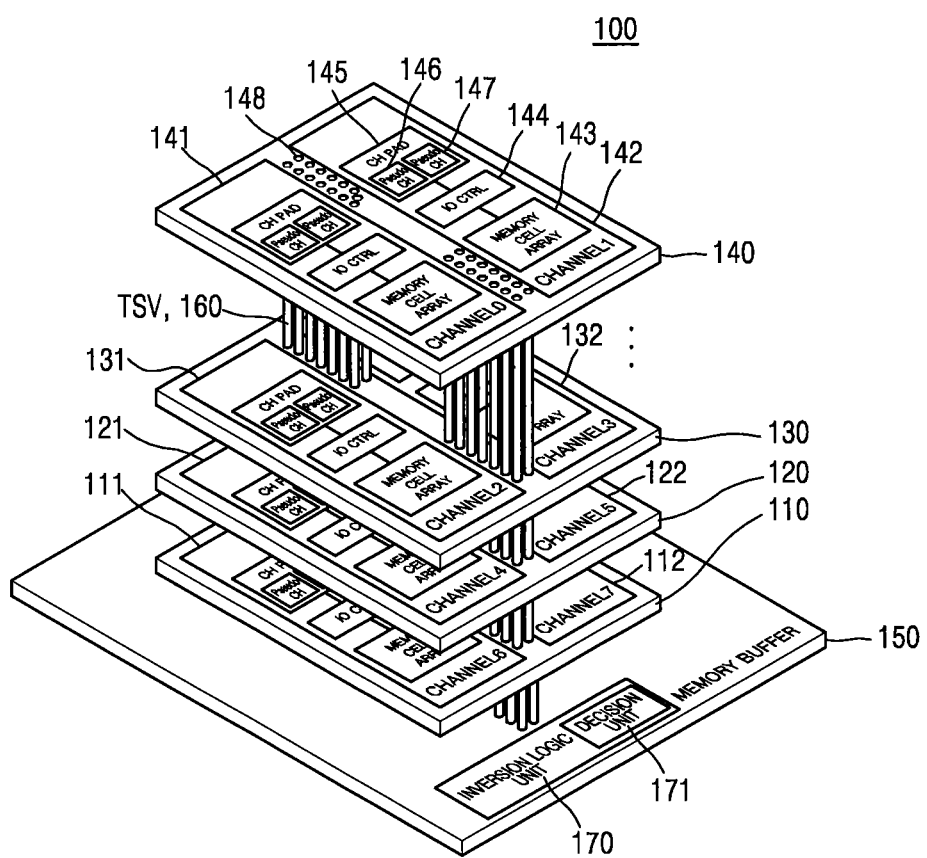
FIG. 1 is a diagram of a memory device according to aspects of the present disclosure.

FIG. 1 is a diagram of a memory device 100 according to aspects of the present disclosure.

Referring to FIG. 1, the memory device 100 may include a plurality of stacked memory layers 110, 120, 130, and 140. The memory device 100 may include high-bandwidth memory (HBM). The memory layers 110, 120, 130, and 140 may include a plurality of separate interfaces, referred to as channels. Each of the memory layers 110, 120, 130, and 140 may include two channels 111-112, 121-122, 131-132, or 141-142, respectively. The present embodiment shows an example of the memory device 100, in which four memory layers 110, 120, 130, and 140, including eight channels, are stacked. In some embodiments, two through eight memory layers may be stacked in the memory device 100.

Each of the channels 111, 112, 121, 122, 131, 132, 141, and 142 may include a memory cell array 143 separately operating for each channel, an input and output controller 144 separately controlling the memory cell array 143 for each channel, and a channel pad unit 145 providing a channel for the memory cell array 143.

The memory cell array 143 may include memory cells connected to a plurality of word lines and a plurality of bit lines, and the memory cells may be grouped as a plurality of memory banks and/or a plurality of memory blocks. A row decoder, a column decoder, a sense amplifier, etc. for accessing the memory cells may be arranged in a region of the memory cell array 143. The input and output controller 144 may include an RAS control logic, a CAS control logic, etc. The channel pad unit 145 may include pads arranged as a matrix shape including a plurality of rows and a plurality of columns. The pads of the channel pad unit 145 may be connected to electrodes 148 and through-silicon-vias (TSV) 160 via wires for signal routing.

The memory device 100 may further include a memory buffer 150 below the stacked memory layers 110, 120, 130, and 140. The memory buffer 150 may include an input buffer (or a receiver) configured to receive a command, an address, a clock, and data from an external memory controller. The memory buffer 150 may buffer the received command, address, clock, and data and provide the buffered command, address, clock, and data to the channels 111, 112, 121, 122, 131, 132, 141, and 142. The memory buffer 150 may provide a signal distribution function and a data input and output function with respect to the channels 111, 112, 121, 122, 131, 132, 141, and 142 via the electrodes 148 and the TSVs 160. The memory buffer 150 may communicate with the memory controller through conductive means formed at an exterior surface of the memory device 100, such as bumps or solder balls.

Each of the memory layers 110, 120, 130, and 140 may include the two channels 111-112, 121-122, 131-132, or 141-142, and a single channel may include two pseudo channels. For example, the number of data input and output (DQ) pads included in a region of the channel pad unit 145 of each of the channels 111, 112, 121, 122, 131, 132, 141, and 142 may be 128. The 128 DQ pads of the channel pad unit 145 of each of the channels 111, 112, 121, 122, 131, 132, 141, and 142 may be divided into two pseudo channels 146 and 147, and the number of the DQ pads of each of the two pseudo channels 146 and 147 may be 64.

According to general data bus inversion (DBI), current data may be inverted, when the current data and previous data are compared with each other and data bits of the current data exceeding half of all the data bits of the current data are transitioned from data bits of the previous data. With respect to data bits of the 64 DQ pads of each of the pseudo channels 146 and 147, one DBI bit may be used for eight data bits (or bytes). When general DBI is performed on 64 data bits of each the pseudo channels 146 and 147, maximum 32 data bits may be transitioned per ½ cycle of a clock signal. In this case, the memory device 100 may have increased power consumption, degraded signal integrity, and heating problems. To solve these problems, multiple DBI, which may be capable of reducing/minimizing the number of data transitions with respect to multiple-bit wide data, such as in HBM, may be desirable.

The memory buffer 150 may include an inversion logic unit 170 for performing multiple DBI. The inversion logic unit 170 may perform the multiple DBI on multiple-bit wide data including M×N (M=8*m, N=8*n, and m and n are natural numbers) data bits transmitted through each of the channels 111, 112, 121, 122, 131, 132, 141, and 142. According to some embodiments, the inversion logic unit 170 may be included in each channel 111, 112, 121, 122, 131, 132, 141, or 142, rather than the memory buffer 150.

The multiple DBI performed by the inversion logic unit 170 may be applied to a DBI AC mode and/or a DBI DC mode. The DBI_AC mode refers to a mode of operation in which bits of data that are currently input are compared with bits of previous data, and when the bits of the current data exceeding half of all the data bits of the current data are transitioned from the bits of the previous data, inversion of the current data is performed. The DBI DC mode refers to a mode of operation in which the number of bits of binary 1 and the number of bits of binary 0 from among bits of each piece of data that is currently input are assessed, and inversion or non-inversion is performed on the current data based on which is greater between the number of bits of binary 1 and the number of bits of binary 0.

The inversion logic unit 170 may perform the multiple DBI operation including a first DBI operation, a second DBI operation, and a third DBI operation, with respect to the multiple-bit wide data including the M×N data bits.

The inversion logic unit 170 may selectively perform the first DBI operation on a first data inversion group in which the M×N data bits are grouped, may selectively perform the second DBI operation on second data inversion groups in which M data bits from among the M×N data bits are grouped, and may selectively perform the third DBI operation on third data inversion groups in which N data bits from among the M×N data bits are grouped.

The inversion logic unit 170 may selectively perform the first DBI operation, the second DBI operation, and the third DBI operation based on a first value or binary 1. According to an embodiment, the first value or binary 1 may indicate a data transition state in the DBI_AC mode. According to another embodiment, the first value may indicate a bit of binary 1 or a bit of binary 0 based on a termination type of a channel in the DBI DC mode. The first value may indicate the bit of binary 1 when the channel is pull-down termination and may indicate the bit of binary 0 when the channel is pull-up termination.

In the first DBI operation, the inversion logic unit 170 may invert the data bits of the first data inversion group by using a first DBI signal, when the number of bits of binary of the first value from among the M×N data bits is greater than M×N/2.

In the second DBI operation, the inversion logic unit 170 may invert the data bits of the second data inversion groups corresponding to the second data inversion group, in which the number of bits of binary of the first value from among the M data bits is greater than M/2, by using second DBI signals respectively corresponding to the second data inversion groups.

In the third DBI operation, the inversion logic unit 170 may invert the data bits of the third data inversion groups corresponding to the third data inversion group, in which the number of bits of binary of the first value from among the N data bits is greater than N/2, by using third DBI signals respectively corresponding to the third data inversion groups. The inversion logic unit 170 may perform a forced second DBI operation in which the data bits of the second data inversion groups are inverted, so that the N data bits of each of the third data inversion groups are filled with binary of the first value.

The inversion logic unit 170 may include a decision unit 171 configured to change an order in which the first DBI operation, the second DBI operation, and the third DBI operation are performed, and configured to decide an order according to which the ultimate number of data transitions is minimized when the multiple DBI operation is performed.

Operation methods of the decision unit 171 for changing an order in which the first DBI operation, the second DBI operation, and the third DBI operation are performed in the multiple DBI operation may be recognized as program codes permanently stored in non-recordable storage media, such as read-only memory (ROM) devices, program codes which may be changeably stored in non-transitory recordable storage media, such as floppy disks, magnetic tapes, CDs, random-access memory (RAM) devices, and/or other magnetic and optical media, or program codes transmitted to computers through communication media, such as electronic networks including the Internet, telephone modem lines, etc.

According to some embodiments, the operation methods of the decision unit 171 for changing the order in which the first DBI operation, the second DBI operation, and the third DBI operation are performed in the multiple DBI operation may be provided as computer programs implemented as a set of encoded commands for execution by a software-executable object or a processor responding to commands.

According to some embodiments, the operation methods of the decision unit 171 for changing the order in which the first DBI operation, the second DBI operation, and the third DBI operation are performed in the multiple DBI operation may be completely or partially implemented by using application-specific integrated circuits (ASICs), field programmable gate arrays (FPGAs), state machines, controllers, devices, other hardware components, or a combination of hardware, software, and firmware.

FIG. 2 is a diagram for describing a general DBI operation.

Referring to FIG. 2, the DBI may be performed, in units of bytes, on data bits of the 64 DQ pads DQ0 through DQ63 of each of the pseudo channels 146 and 147 described in FIG. 1. For example, the data bits of the DQ pads DQ0 through DQ63 may be formed as a data bit structure of 8 rows and 8 columns. The data bits of the DQ pads DQ0 through DQ7 may be included in the first column, the data bits of the DQ pads DQ8 through DQ15 may be included in the second column, the data bits of the DQ pads DQ16 through DQ23 may be included in the third column, the data bits of the DQ pads DQ24 through DQ31 may be included in the fourth column, the data bits of the DQ pads DQ32 through DQ39 may be included in the fifth column, the data bits of the DQ pads DQ40 through DQ47 may be included in the sixth column, the data bits of the DQ pads DQ48 through DQ55 may be included in the seventh column, and the data bits of the DQ pads DQ56 through DQ63 may be included in the eighth column.

General DBI is an example of performing the DBI DC mode. According to the general DBI, DBI signals DBI0 through DBI7 indicating whether or not to perform data inversion on a corresponding column, with respect to byte data of a column unit, may be added. When, for example, the number of data bits of binary 1 from among the data bits of the DQ pads DQ0 through DQ7 included in the first column is greater than four (4), the DBI signal DBI0 may be set as logic high, and the data bits of the DQ pads DQ0 through DQ7 may be inverted in response to the DBI signal DBI0 of logic high. When the number of data bits of binary 1 from among the data bits of the DQ pads DQ0 through DQ7 of the first column is equal to or less than 4, the DBI signal DBI0 may be set as logic low, and the data bits of the DQ pads DQ0 through DQ7 may not be inverted. Based on this way, each of the DBI signals DBI0 through DBI7 may determine whether or not to perform inversion on byte data of the corresponding column. Hereinafter, the general DBI will be compared with the multiple DBI according to the inventive concepts provided herein.

FIG. 3 is a diagram for describing the multiple DBI operation with respect to multiple-bit wide data, according to aspects of the present disclosure.

Referring to FIG. 3, the multiple DBI operation may include a first DBI operation, a second DBI operation, and a third DBI operation with respect to the multiple-bit wide data including data bits of 64 DQ pads DQ0 through DQ63.

The data bits of the DQ pads DQ0 through DQ63 may be formed as a data bit structure including eight rows and eight columns, as described in FIG. 2.

A first DBI signal DBI_ALL indicating data inversion on all of the data bits of the DQ pads DQ0 through DQ63 included in the 8×8 data bit structure.

With respect to column directions of the 8×8 data bit structure, the data bits of the DQ pads DQ0 through DQ7 may be included in the first column, the data bits of the DQ pads DQ8 through DQ15 may be included in the second column, the data bits of the DQ pads DQ16 through DQ23 may be included in the third column, the data bits of the DQ pads DQ24 through DQ31 may be included in the fourth column, the data bits of the DQ pads DQ32 through DQ39 may be included in the fifth column, the data bits of the DQ pads DQ40 through DQ47 may be included in the sixth column, the data bits of the DQ pads DQ48 through DQ55 may be included in the seventh column, and the data bits of the DQ pads DQ56 through DQ63 may be included in the eighth column. Also, with respect to byte data of the first through eighth columns, second DBI signals DBI_V0 through DBI_V7 indicating data inversion on the byte data of a corresponding column may be included.

With respect to row directions of the 8×8 data bit structure, the data bits of the DQ pads DQ0, DQ8, DQ16, DQ24, DQ32, DQ40, DQ48, and DQ56 may be included in the first row, the data bits of the DQ pads DQ1, DQ9, DQ17, DQ25, DQ33, DQ41, DQ49, and DQ57 may be included in the second row, the data bits of the DQ pads DQ2, DQ10, DQ18, DQ26, DQ34, DQ42, DQ50, and DQ58 may be included in the third row, the data bits of the DQ pads DQ3, DQ11, DQ19, DQ27, DQ35, DQ43, DQ51, and DQ59 may be included in the fourth row, the data bits of the DQ pads DQ4, DQ12, DQ20, DQ28, DQ36, DQ44, DQ52, and DQ60 may be included in the fifth row, the data bits of the DQ pads DQ5, DQ13, DQ21, DQ29, DQ37, DQ45, DQ53, and DQ61 may be included in the sixth row, the data bits of the DQ pads DQ6, DQ14, DQ22, DQ30, DQ38, DQ46, DQ54, and DQ62 may be included in the seventh row, and the data bits of the DQ pads DQ7, DQ15, DQ23, DQ31, DQ39, DQ47, DQ55, and DQ63 may be included in the eighth row. Also, with respect to byte data of the first through eighth rows, third DBI signals DBI_H0 through DBI_H7 indicating data inversion on the byte data of a corresponding row may be included.

The first DBI may determine whether or not to perform data inversion on the data bits of the DQ pads DQ0 through DQ63 and may perform the data inversion on the data bits of the DQ pads DQ0 through DQ63, in response to the first DBI signal DBI_ALL, in the 8×8 data bit structure. For example, according to the first DBI, when the number of data bits having binary 1 from among the data bits of the DQ pads DQ0 through DQ63 is greater than 32, which is half of all the data bits, the data bits of the DQ pads DQ0 through DQ63 may be inverted. All of the data bits of the DQ pads DQ0 through DQ63 may be inverted in response to logic high of the first DBI signal DBI_ALL, and none of the data bits of the DQ pads DQ0 through DQ63 may be inverted in response to logic low of the first DBI signal DBI_ALL.

The second DBI may determine whether or not to perform data inversion on eight data bits of a corresponding column and may perform the data inversion on the eight data bits of the corresponding column, in the 8×8 data bit structure, in response to each of the second DBI signals DBI_V0 through DBI_V7. For example, according to the second DBI, when the number of data bits having binary 1 from among the eight data bits of the corresponding column is greater than four (4), which is the half of all the data bits, the data bits of the corresponding column may be inverted. The data bits of the DQ pads DQ0 through DQ7 of the first column may be inverted in response to logic high of the second DBI signal DBI_V0 and the data bits of the DQ pads DQ0 through DQ7 of the first column may not be inverted in response to logic low of the second DBI signal DBI_V0. The data bits of the DQ pads DQ8 through DQ15 of the second column may be inverted in response to logic high of the second DBI signal DBI_V1 and the data bits of the DQ pads DQ8 through DQ15 of the second column may not be inverted in response to logic low of the second DBI signal DBI_V1. Based on this way, data inversion of the data bits of the DQ pads DQ16 through DQ23 of the third column may be determined based on the second DBI signal DBI_V2, data inversion of the data bits of the DQ pads DQ24 through DQ31 of the fourth column may be determined based on the second DBI signal DBI_V3, data inversion of the data bits of the DQ pads DQ32 through DQ39 of the fifth column may be determined based on the second DBI signal DBI_V4, data inversion of the data bits of the DQ pads DQ40 through DQ47 of the sixth column may be determined based on the second DBI signal DBI_V5, data inversion of the data bits of the DQ pads DQ48 through DQ55 of the seventh column may be determined based on the second DBI signal DBI_V6, and data inversion of the data bits of the DQ pads DQ56 through DQ63 of the eighth column may be determined based on the second DBI signal DBI_V7.

The third DBI may determine whether or not to perform data inversion on byte data of a corresponding row and may perform the data inversion on the byte data of the corresponding row, in response to each of the third DBI signals DBI_H0 through DBI_H7, in the 8×8 data bit structure. For example, according to the third DBI, when the number of data bits having binary 1 from among eight data bits of the corresponding row is greater than four (4), which is the half of all the data bits, the data bits of the corresponding row may be inverted. The data bits of the DQ pads DQ0, DQ8, DQ16, DQ24, DQ32, DQ40, DQ48, and DQ56 of the first row may be inverted in response to logic high of the third DBI signal DBI_H0 and the data bits of the DQ pads DQ0, DQ8, DQ16, DQ24, DQ32, DQ40, DQ48, and DQ56 of the first row may not be inverted in response to logic low of the third DBI signal DBI_H0. The data bits of the DQ pads DQ1, DQ9, DQ17, DQ25, DQ33, DQ41, DQ49, and DQ57 of the second row may be inverted in response to logic high of the third DBI signal DBI_H1 and the data bits of the DQ pads DQ1, DQ9, DQ17, DQ25, DQ33, DQ41, DQ49, and DQ57 of the second row may not be inverted in response to logic low of the third DBI signal DBI_H1. Based on this way, data inversion of the data bits of the DQ pads DQ2, DQ10, DQ18, DQ26, DQ34, DQ42, DQ50, and DQ58 of the third row may be determined based on the third DBI signal DBI_H2, data inversion of the data bits of the DQ pads DQ3, DQ11, DQ19, DQ27, DQ35, DQ43, DQ51, and DQ59 of the fourth row may be determined based on the third DBI signal DBI_H3, data inversion of the data bits of the DQ pads DQ4, DQ12, DQ20, DQ28, DQ36, DQ44, DQ52, and DQ60 of the fifth row may be determined based on the third DBI signal DBI_H4, data inversion of the data bits of the DQ pads DQ5, DQ13, DQ21, DQ29, DQ37, DQ45, DQ53, and DQ61 of the sixth row may be determined based on the third DBI signal DBI_H5, data inversion of the data bits of the DQ pads DQ6, DQ14, DQ22, DQ30, DQ38, DQ46, DQ54, and DQ62 of the seventh row may be determined based on the third DBI signal DBI_H6, and data inversion of the data bits of the DQ pads DQ7, DQ15, DQ23, DQ31, DQ39, DQ47, DQ55, and DQ63 of the eighth row may be determined based on the third DBI signal DBI_H7.

Figure 4A:
FIGS. 4A and 4B are diagrams for describing a method of performing multiple DBI, according to aspects of the present disclosure.
Figure 4B:
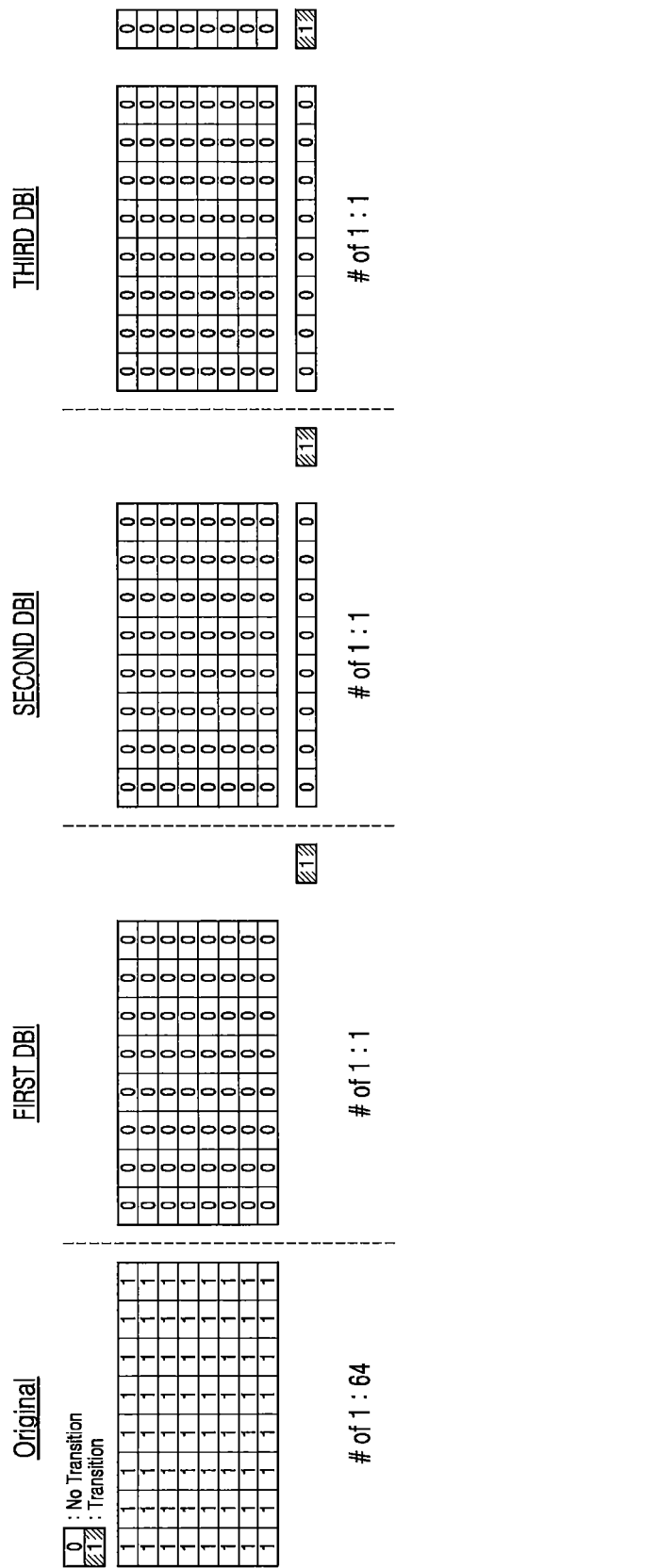

FIGS. 4A and 4B are diagrams showing examples in which the number of data transitions is minimized by using the multiple DBI of FIG. 3. In FIGS. 4A and 4B, cases in which a data value DQ[63:0] is formed of 0xFFFF FFFF FFFF FFFF are described. FIG. 4A shows a result of performing the general DBI of FIG. 2, and FIG. 4B shows a result of performing the multiple DBI of FIG. 3 as a comparative example to the example of FIG. 4A. For convenience of explanation, it is defined that binary 1 in the 8×8 data bit structure indicates a state in which data transition occurs and binary 0 indicates a state in which data transition does not occur.

Referring to FIG. 4A, when the data value DQ[63:0] is formed of 0xFFFF FFFF FFFF FFFF, the data bits of the DQ pads DQ0 through DQ63 in the 8×8 data bit structure are filled with binary 1. When the general DBI of FIG. 2 is performed, the data bits of the DQ pads DQ0 through DQ63 may be inverted to binary 0, in response to logic high (hereinafter, may be commonly referred to as binary 1 of the data transition state) of the DBI signals DBI0 through DBI7. Accordingly, the number of data bits of binary 1, which is obtained by performing the general DBI, may be eight, corresponding to the sum of the DBI signals DBI0 through DBI7.

Referring to FIG. 4B, when the data value DQ [63:0] is formed of 0xFFFF FFFF FFFF FFFF, the data bits of the DQ pads DQ0 through DQ63 in the 8×8 data bit structure are filled with binary 1. When the first DBI of the multiple DBI of FIG. 3 is performed, all of the data bits of the DQ pads DQ0 through DQ63 may be inverted to binary 0, in response to logic high of the first DBI signal DBI_ALL. Then, inversion may not be performed in the second DBI and the third DBI. Accordingly, the number of data bits of binary 1, which is obtained by performing the multiple DBI, may be one, corresponding to the first DBI signal DBI_ALL.

As shown in FIGS. 4A and 4B, the first DBI of the multiple DBI has the effect of reducing the number of data transitions from eight, which is obtained based on the general DBI, to one. By reducing the number of data transitions by the multiple DBI, power consumption may be reduced. Also, cross talk, SSN, and ISI on the data bus or channel may be decreased.

Figure 5B:
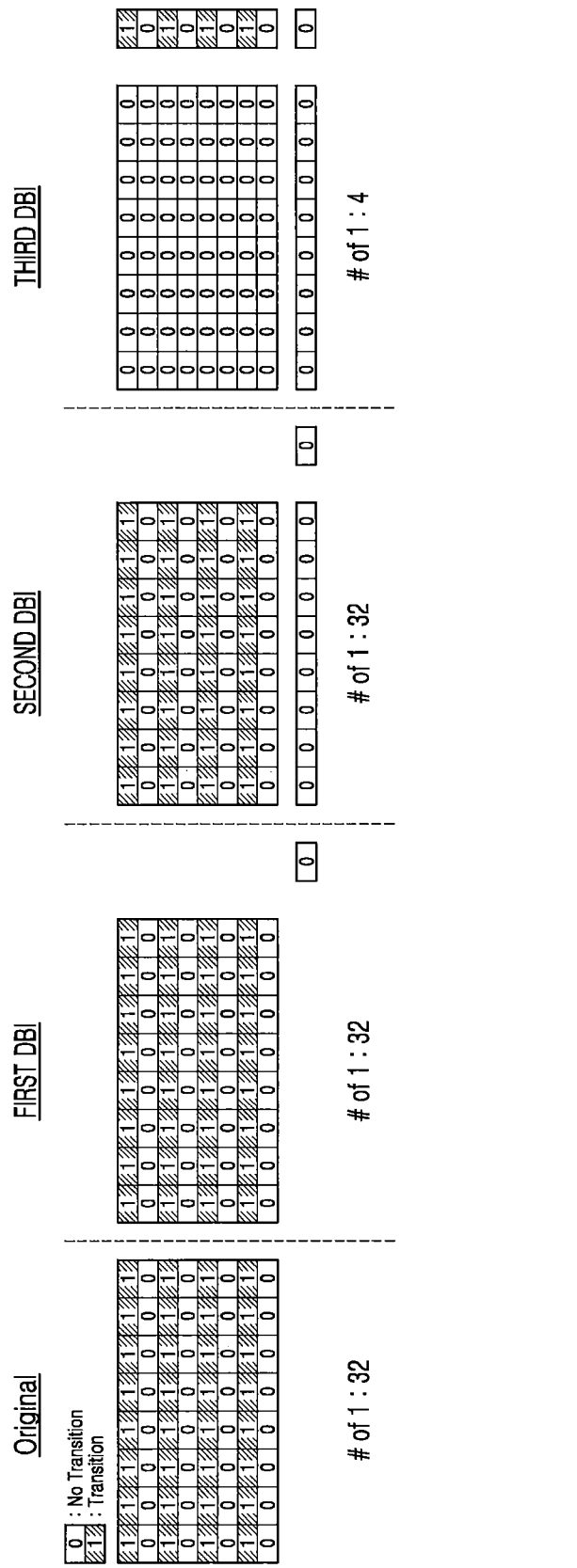

FIGS. 5A and 5B are diagrams showing examples in which the number of data transitions is minimized by using the multiple DBI of FIG. 3. In FIGS. 5A and 5B, cases in which the data value DQ[63:0] is formed of 0x5555 5555 5555 5555 are described. FIG. 5A shows a result of performing the general DBI of FIG. 2, and FIG. 5B shows a result of performing the multiple DBI of FIG. 3 as a comparative example to the example of FIG. 5A.

Referring to FIG. 5A, when the data value DQ [63:0] is formed of 0x5555 5555 5555 5555, the data bits of the DQ pads DQ0 through DQ63 in the 8×8 data bit structure are sequentially filled with units of bytes 1-0-1-0-1-0-1-0, and the number of data bits of binary 1 is 32. When the general DBI of FIG. 2 is performed, the number of data bits of binary 1 in the byte data is not greater than four (4), and thus, the data bits of the DQ pads DQ0 through DQ63 may not be inverted and may maintain an original state, in response to logic low of the DBI signals DBI0 through DBI7. Accordingly, the number of data bits of binary 1, which is obtained by performing the general DBI, may be 32.

Referring to FIG. 5B, when the data value DQ [63:0] is formed of 0x5555 5555 5555 5555, the number of data bits of binary 1 from among the data bits of the DQ pads DQ0 through DQ63 in the 8×8 data bit structure is 32. Inversion operations of the first DBI and the second DBI of the multiple DBI of FIG. 3 may not be performed. The data bits of the DQ pads DQ0 through DQ63 may not be inverted and may maintain an original state, in response to logic low of the first DBI signal DBI_ALL and the second DBI signals DBI_V0 through DBI_V7. Then, the third DBI may be performed to determine whether or not to perform data inversion on the byte data of a corresponding row and to perform the data inversion on the byte data of the corresponding row, in response to each of the third DBI signals DBI_H0 through DBI_H7. The number of data bits of binary 1 in the byte data of the first, third, fifth, and seventh rows is greater than 4, and thus, the data of binary 1 of the first, third, fifth, and seventh rows may be inverted to data of binary 0, in response to logic high of the third DBI signals DBI_H0, DBI_H2, DBI_H4, and DBI_H6. Accordingly, the number of data bits of binary 1, which is obtained by performing the multiple DBI, may be four, corresponding to the third DBI signals DBI_H0, DBI_H2, DBI_H4, and DBI_H6.

As shown in FIGS. 5A and 5B, the third DBI of the multiple DBI has the effect of reducing the number of data transitions from 32, which is obtained based on the general DBI, to 4. By reducing the number of data transitions by the multiple DBI, power consumption, cross talk, SSN, and ISI may be reduced.

Figure 6B:
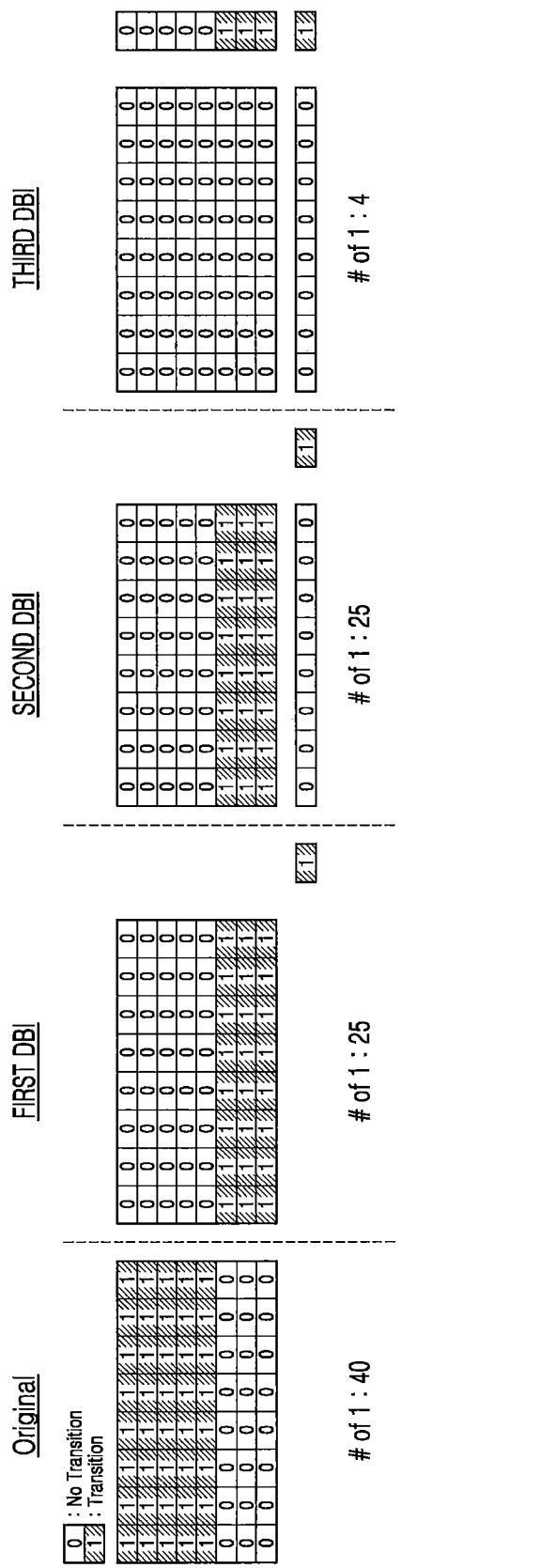

FIGS. 6A and 6B are diagrams showing examples in which the number of data transitions is minimized by using the multiple DBI of FIG. 3. In FIGS. 6A and 6B, cases in which the data value DQ [63:0] is formed of 0x1F1F 1F1F 1F1F 1F1F are described. FIG. 6A shows a result of performing the general DBI of FIG. 2, and FIG. 6B shows a result of performing the multiple DBI of FIG. 3 as a comparative example to the example of FIG. 6A.

Referring to FIG. 6A, when the data value DQ[63:0] is formed of 0x1F1F 1F1F 1F1F 1F1F, the number of data bits of binary 1 from among the data bits of the DQ pads DQ0 through DQ63 in the 8×8 data bit structure is 40. When the general DBI of FIG. 2 is performed, the number of data bits of binary 1 in byte data is greater than four, and thus, the data bits of the DQ pads DQ0 through DQ55 may be inverted in response to logic high of the DBI signals DBI0 through DBI6. Accordingly, the number of data bits of binary 1, which is obtained by performing the general DBI, may be 32.

Referring to FIG. 6B, when the data value DQ [63:0] is formed of 0x1F1F 1F1F 1F1F 1F1F, the number of data bits of binary 1 from among the data bits of the DQ pads DQ0 through DQ63 in the 8×8 data bit structure is 40. The first DBI of the multiple DBI of FIG. 3 may be performed to invert all of the data bits of the DQ pads DQ0 through DQ63 in response to logic high of the first DBI signal DBI_ALL. Then, inversion of the second DBI not be performed, and the data bits of the DQ pads DQ0 through DQ63 may maintain a non-inverted state in response to logic low of the second DBI signals DBI through DBI_V7. Then, the third DBI may be performed to determine whether or not to invert byte data of a corresponding row and invert the byte data of the corresponding row, in response to each of the third DBI signals DBI_H0 through DBI_H7. The number of data bits of binary 1 in the byte data of the sixth, seventh, and eighth rows is greater than four, and thus, the data of binary 1 of the sixth, seventh, and eighth rows may be inverted to data of binary 0, in response to logic high of the third DBI signals DBI_H5, DBI_H6, and DBI_H7. Accordingly, the number of data bits of binary 1, which is obtained by performing the multiple DBI, may be four, corresponding to the first DBI signal DBI and the third DBI signals DBI_H5, DBI_H6, and DBI_H7.

As shown in FIGS. 6A and 6B, the third DBI of the multiple DBI has the effect of reducing the number of data transitions from 32, which is obtained based on the general DBI, to 4. By reducing the number of data transitions by the multiple DBI, power consumption, cross talk, SSN, and ISI may be reduced.

Figure 7A:
FIGS. 7A and 7B are diagrams for describing a method of performing multiple DBI, according to aspects of the present disclosure.
Figure 7B:
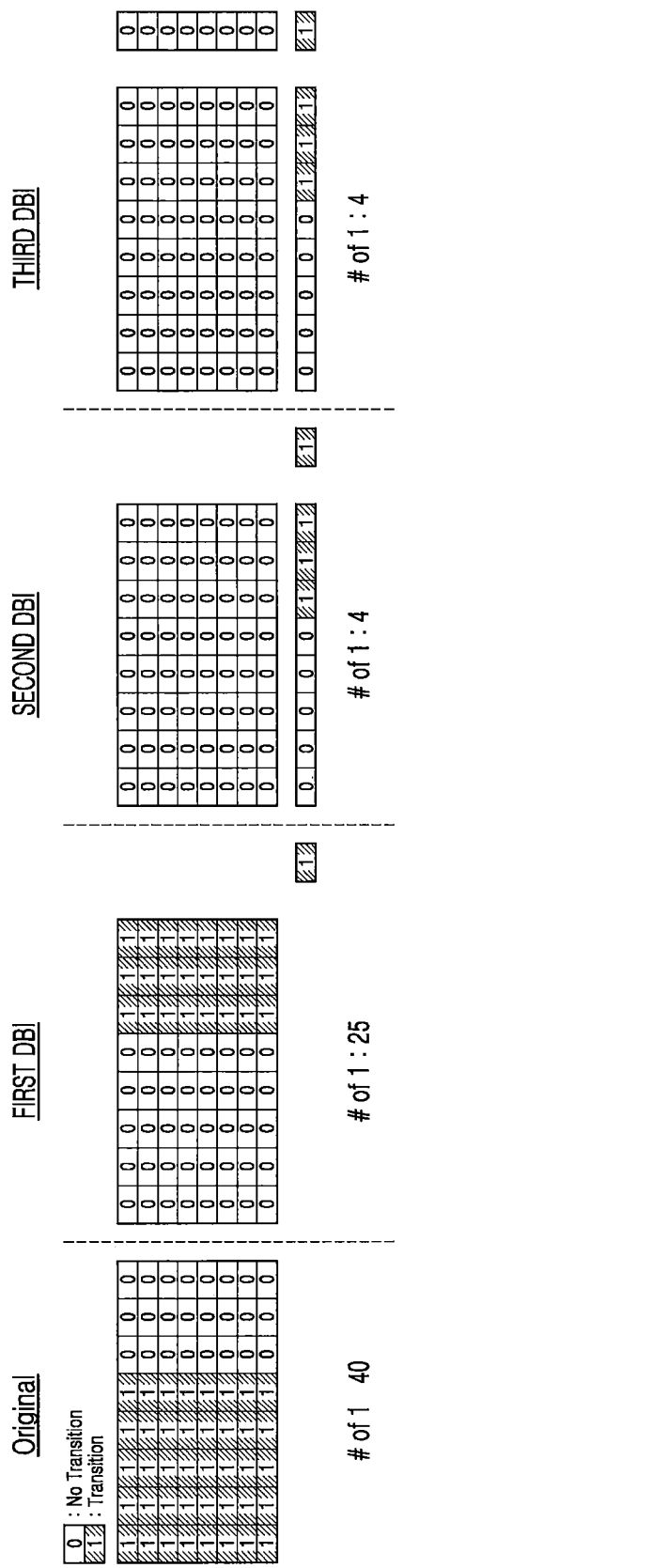

FIGS. 7A and 7B are diagrams showing examples in which the number of data transitions is minimized by using the multiple DBI of FIG. 3. In FIGS. 7A and 7B, cases in which the data value DQ [63:0] is formed of 0x0000 00FF FFFF FFFF are described. FIG. 7A shows a result of performing the general DBI of FIG. 2, and FIG. 7B shows a result of performing the multiple DBI of FIG. 3 as a comparative example to the example of FIG. 7A.

Referring to FIG. 7A, when the data value DQ [63:0] is formed of 0x0000 00FF FFFF FFFF, the number of data bits of binary 1 from among the data bits of the DQ pads DQ0 through DQ63 in the 8×8 data bit 1 is 40. When the general DBI of FIG. 2 is performed, the number of data bits of binary 1 in the byte data is greater than 4, and thus, all of the data bits of the DQ pads DQ0 through DQ39 may be inverted to binary 0, in response to logic high of the DBI signals DBI0 through DBI4. Accordingly, the number of data bits of binary 1, which is obtained by performing the general DBI, may be five, corresponding to the DBI signals DBI0 through DBI4.

Referring to FIG. 7B, when the data value DQ [63:0] is formed of 0x0000 00FF FFFF FFFF, the number of data bits of binary 1 from among the data bits of the DQ pads DQ0 through DQ63 in the 8×8 data bit structure is 40. The first DBI of the multiple DBI of FIG. 3 may be performed to invert all of the data bits of the DQ pads DQ0 through DQ63 in response to logic high of the first DBI signal DBI_ALL. Then, the second DBI may be performed to determine whether or not to perform data inversion on byte data of a corresponding column and perform the data inversion on the byte data of the corresponding column, in response to each of the second DBI signals DBI_V0 through DBI_V7. The number of data bits of binary 1 in the byte data of the sixth, seventh, and eighth columns is greater than 4, and thus, the data of binary 1 of the sixth, seventh, and eighth columns may be inverted to data of binary 0 in response to logic high of the second DBI signals DBI_V5, DBI_V6, and DBI_V7. Thereafter, inversion of the third DBI may not be performed, and the data bits of the DQ pads dDQ0 through DQ63 may maintain a non-inverted state in response to logic low of the third DBI signals DBI_H0 through DBI_H7. Accordingly, the number of data bits of binary 1, which is obtained by performing the multiple DBI, may be 4, corresponding to the first DBI signal DBI_ALL and the second DBI signals DBI_V6, and DBI_V7.

As shown in FIGS. 7A and 7B, the third DBI of the multiple DBI has the effect of reducing the number of data transitions from 5, which is obtained based on the general DBI, to 4. By reducing the number of data transitions by the multiple DBI, power consumption, cross talk, SSN, and ISI may be reduced.

Figure 8:
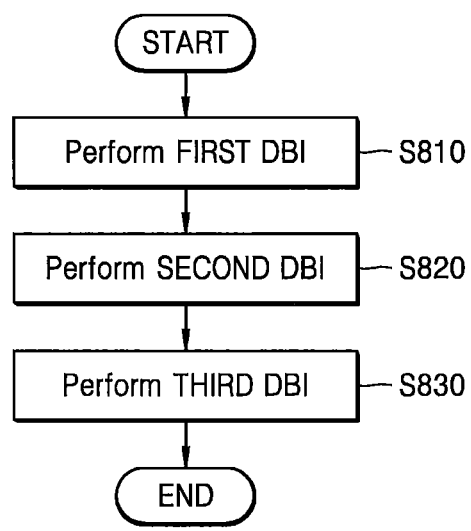
FIG. 8 is a flowchart of the methods of performing multiple DBI of FIGS. 4A through 7B.

FIG. 8 is a flowchart of methods of performing the multiple DBI of FIGS. 4A through 7B. The 8×8 data bit structure described in FIGS. 4A through 7B is given as an example based on multiple-bit wide data of an M×N (M=8*m, N=8*n, and m and n are natural numbers) data bit structure. FIG. 8 describes the multiple DBI applied to the M×N data bit structure.

Referring to FIG. 8, in operation S810, the first DBI for determining whether or not to perform data inversion on all of the data bits included in the M×N data bit structure may be performed. In the first DBI, for example, when the number of data bits of binary 1 from among all of the data bits included in the M×N data bit structure is greater than M×N/2, which is half of M×N data bits, all of the data bits included in the M×N data bit structure may be inverted. When the number of data bits of binary 1 is not greater than M×N/2, inversion may not be performed in the first DBI.

In operation S820, the second DBI for determining whether or not to perform data inversion on M data bits of a corresponding column from among the data bits of first through $N^{th}$ columns grouped by M data bits in a column direction in the M×N data bit structure may be performed. In the second DBI, for example, when the number of data bits of binary 1 from among the data bits of the corresponding column is greater than M/2, which is half of the M data bits, the data bits of the corresponding column may be inverted. When the number of data bits of binary 1 is not greater than M/2, inversion may not be performed in the second DBI.

In operation S830, the third DBI for determining whether or not to perform data inversion on N data bits of a corresponding row from among the data bits of first through $M^{th}$ rows grouped by N data bits in a row direction in the M×N data bit structure may be performed. In the third DBI, for example, when the number of data bits of binary 1 from among the data bits of the corresponding row is greater than N/2, which is half of the N data bits, the data bits of the corresponding row may be inverted. When the number of data bits of binary 1 is not greater than N/2, inversion may not be performed in the third DBI.

Since operations S810 through S830 may be sequentially performed on the multiple-bit wide data of the M×N data bit structure, the number of data transitions may be minimized by the first DBI, the second DBI, and the third DBI of the multiple DBI. Accordingly, a memory device performing the multiple DBI may reduce power consumption, cross talk, SSN, and ISI.

Figure 9A:
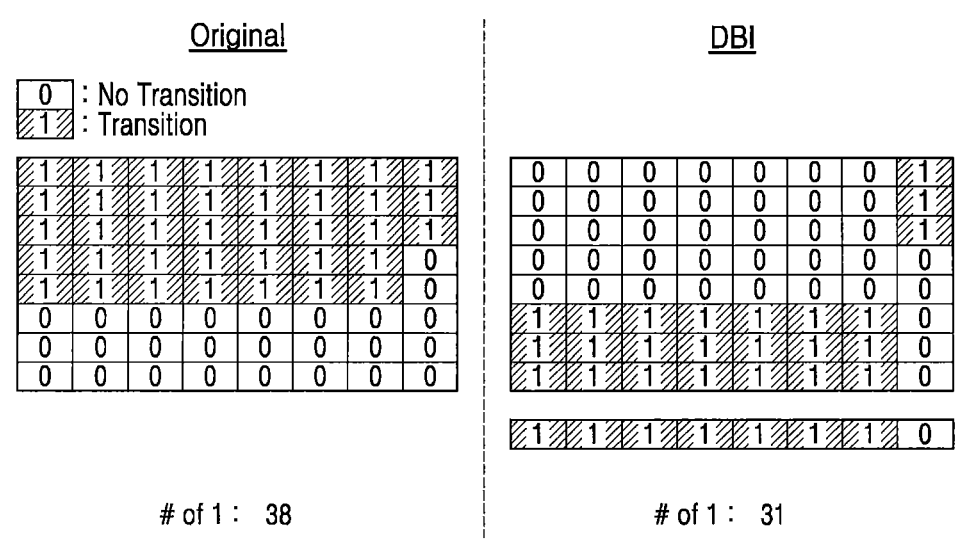

FIGS. 9A through 9C are diagrams showing examples in which the number of data transitions is minimized by using the multiple DBI of FIG. 3. In FIGS. 9A through 9C, cases in which the data value DQ [63:0] is formed of 0x071F 1F1F 1F1F 1F1F are described. FIG. 9A shows a result of performing the general DBI of FIG. 2, and FIGS. 9B and 9C show results of performing the multiple DBI of FIG. 3 as comparative examples to the example of FIG. 9A. FIGS. 9B and 9C describe examples in which the minimum number of data transitions may vary based on a change in operation order of the second DBI and the third DBI of the multiple DBI.

Referring to FIG. 9A, when the data value DQ [63:0] is formed of 0x071F 1F1F 1F1F 1F1F, the number of data bits of binary 1 from among the data bits of the DQ pads DQ0 through DQ63 in the 8×8 data bit structure is 38. When the general DBI of FIG. 2 is performed, the number of data bits of binary 1 in byte data is greater than 4, and thus, the data bits of the first through seventh columns may be inverted in response to logic high of the DBI signals DBI0 through DBI6. Accordingly, the number of data bits of binary 1, which is obtained by performing the general DBI, may be 31.

Referring to FIG. 9B, when the data value DQ [63:0] is formed of 0x071F 1F1F 1F1F 1F1F, the number of data bits of binary 1 from among the data bits of the DQ pads DQ0 through DQ63 in the 8×8 data bit structure is 38. The first DBI of the multiple DBI of FIG. 3 may be performed to invert all of the data bits of the DQ pads DQ0 through DQ63, in response to logic high of the first DBI signal DBI_ALL. Then, the second DBI may be performed to determine whether or not to perform data inversion on byte data of a corresponding column and perform the data inversion on the byte data of the corresponding column, in response to each of the second DBI signals DBI_V0 through DBI_V7. The number of data bits of binary 1 in the byte data of the eighth column is greater than 4, and thus, the data bits of the eighth column may be inverted in response to logic high of the second DBI signal DBI_V7. Thereafter, the third DBI may be performed to determine whether or not to perform data inversion on byte data of a corresponding row and perform the data inversion on the byte data of the corresponding row, in response to each of the third DBI signals DBI_H0 through DBI_H7. The number of data bits of binary 1 in the byte data of the sixth, seventh, and eighth rows is greater than 4, and thus, the data bits of the sixth, seventh, and eighth rows may be inverted in response to logic high of the third DBI signals DBI_H5, DBI_H6, and DBI_H7. Accordingly, the number of data bits of binary 1, which is obtained by performing the multiple DBI, may be 11.

Referring to FIG. 9C, when the data value DQ [63:0] is formed of 0x071F 1F1F 1F1F 1F1F, the number of data bits of binary 1 from among the data bits of the DQ pads DQ0 through DQ63 in the 8×8 data bit structure is 38. The first DBI of the multiple DBI of FIG. 3 may be performed to invert all of the data bits of the DQ pads DQ0 through DQ63, in response to logic high of the first DBI signal DBI_ALL. Then, the third DBI may be performed to determine whether or not to perform data inversion on the byte data of the corresponding row and perform the data inversion on the byte data of the corresponding row, in response to each of the third DBI signals DBI_H0 through DBI_H7. The number of data bits of binary 1 in the byte data of the sixth, seventh, and eighth rows is greater than 4, and thus, the data bits of the sixth, seventh, and eighth rows may be inverted in response to logic high of the third DBI signals DBI_H5, DBI_H6, and DBI_H7. Thereafter, inversion may not be performed in the second DBI, and the data bits of the DQ pads DQ0 through DQ63 may maintain a non-inverted state in response to logic low of the second DBI signals DBI_V0 through DBI_V7. Accordingly, the number of data bits of binary 1, which is obtained by performing the multiple DBI, may be 6.

As shown in FIGS. 9A through 9C, the multiple DBI has the effect of reducing the number of data transitions from 31, which is obtained based on the general DBI, to 11 or 6. Also, when the third DBI is performed before the second DBI in the multiple DBI, the number of data transitions may be further reduced from 11, which is obtained by performing the second DBI before the third DBI in the multiple DBI, to 6. By further reducing the number of data transitions by changing an operation order of the second DBI and the third DBI in the multiple DBI, power consumption, cross talk, SSN, and ISI may be reduced.

Figure 10B:
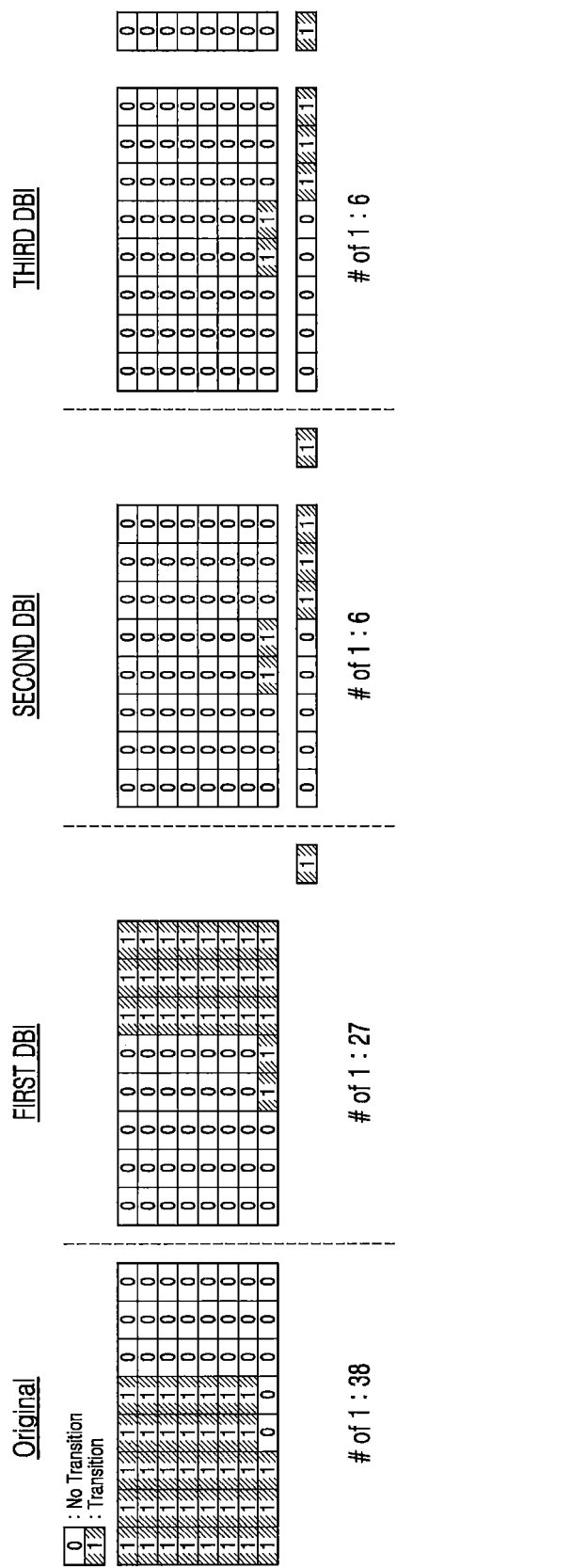
Figure 10C:
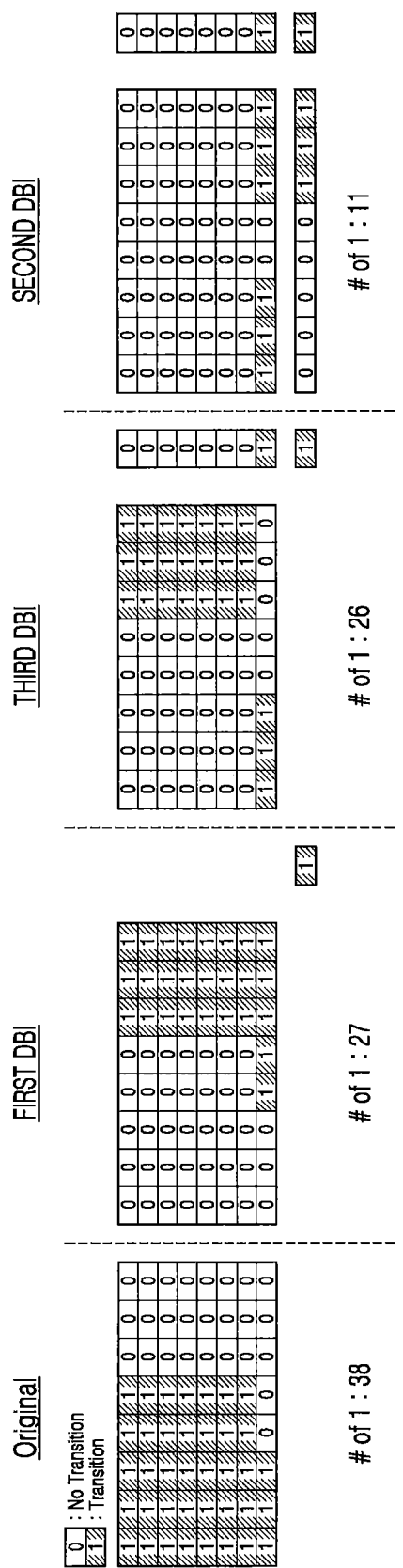

FIGS. 10A through 10C are diagrams showing examples in which the number of data transitions is minimized by using the multiple DBI of FIG. 3. In FIGS. 10A through 10C, cases in which the data value DQ[63:0] is formed of 0x0000 007F FFFF FFFF are described. FIG. 10A shows a result of performing the general DBI of FIG. 2, and FIGS. 10B and 10C show results of performing the multiple DBI of FIG. 3 as comparative examples to the example of FIG. 10A. FIGS. 10B and 10C describe examples in which the minimum number of data transitions may vary based on a change in operation order of the second DBI and the third DBI of the multiple DBI.

Referring to FIG. 10A, when the data value DQ [63:0] is formed of 0x0000 007F FFFF FFFF, the number of data bits of binary 1 from among the data bits of the DQ pads DQ0 through DQ63 in the 8×8 data bit structure is 38. When the general DBI of FIG. 2 is performed, the number of data bits of binary 1 in byte data is greater than 4, and thus, the data bits of the first through fifth columns may be inverted in response to logic high of the DBI signals DBI0 through DBI4. Accordingly, the number of data bits of binary 1, which is obtained by performing the general DBI, may be 7.

Referring to FIG. 10B, when the data value DQ [63:0] is formed of 0x0000 007F FFFF FFFF, the number of data bits of binary 1 from among the data bits of the DQ pads DQ0 through DQ63 in the 8×8 data bit structure is 38. The first DBI of the multiple DBI of FIG. 3 may be performed to invert all of the data bits of the DQ pads DQ0 through DQ63, in response to logic high of the first DBI signal DBI_ALL. Then, the second DBI may be performed to determine whether or not to perform data inversion on byte data of a corresponding column and perform the data inversion on the byte data of the corresponding column, in response to each of the second DBI signals DBI_V0 through DBI_V7. The number of data bits of binary 1 in the byte data of the sixth, seventh, and eighth columns is greater than 4, and thus, the data bits of the sixth, seventh, and eighth columns may be inverted in response to logic high of the second DBI signals DBI_V5, DBI_V6, and DBI_V7. Thereafter, the third DBI may not be performed and the data bits of the DQ pads DQ0 through DQ63 may maintain a non-inverted state in response to logic low of the third DBI signals DBI_H0 through DBI_H7. Accordingly, the number of data bits of binary 1, which is obtained by performing the multiple DBI, may be 6.

Referring to FIG. 10C, when the data value DQ [63:0] is formed of 0x0000 007F FFFF FFFF, the number of data bits of binary 1 from among the data bits of the DQ pads DQ0 through DQ63 in the 8×8 data bit structure is 38. The first DBI of the multiple DBI of FIG. 3 may be performed to invert all of the data bits of the DQ pads DQ0 through DQ63, in response to logic high of the first DBI signal DBI_ALL. Then, the third DBI may be performed to determine whether or not to perform data inversion on byte data of a corresponding row and perform the data inversion on the byte data of the corresponding row, in response to each of the third DBI signals DBI_H0 through DBI_H7. The number of data bits of binary 1 in the byte data of the eighth row is greater than 4, and thus, the data bits of the eighth row may be inverted in response to logic high of the third DBI signal DBI_H7. Thereafter, the second DBI may be performed to determine whether or not to perform data inversion on the byte data of the corresponding column and perform the data inversion on the byte data of the corresponding column, in response to each of the second DBI signals DBI_V0 through DBI_V7. The number of data bits of binary 1 in the byte data of the sixth, seventh, and eighth columns is greater than 4, and thus, the data bits of the sixth, seventh, and eighth columns may be inverted in response to logic high of the second DBI signals DBI_V5, DBI_V6, and DBI_V7. Accordingly, the number of data bits of binary 1, which is obtained by performing the multiple DBI, may be 11.

As shown in FIGS. 10A through 10C, the multiple DBI has the effect of reducing the number of data transitions from 7, which is obtained based on the general DBI, to 6 or 11. Also, when the second DBI is performed before the third DBI in the multiple DBI, the number of data transitions may be further reduced from 11, which is obtained by performing the second DBI after the third DBI in the multiple DBI, to 6. By further reducing the number of data transitions by changing an operation order of the second DBI and the third DBI in the multiple DBI, power consumption, cross talk, SSN, and ISI may be reduced.

Figure 11:
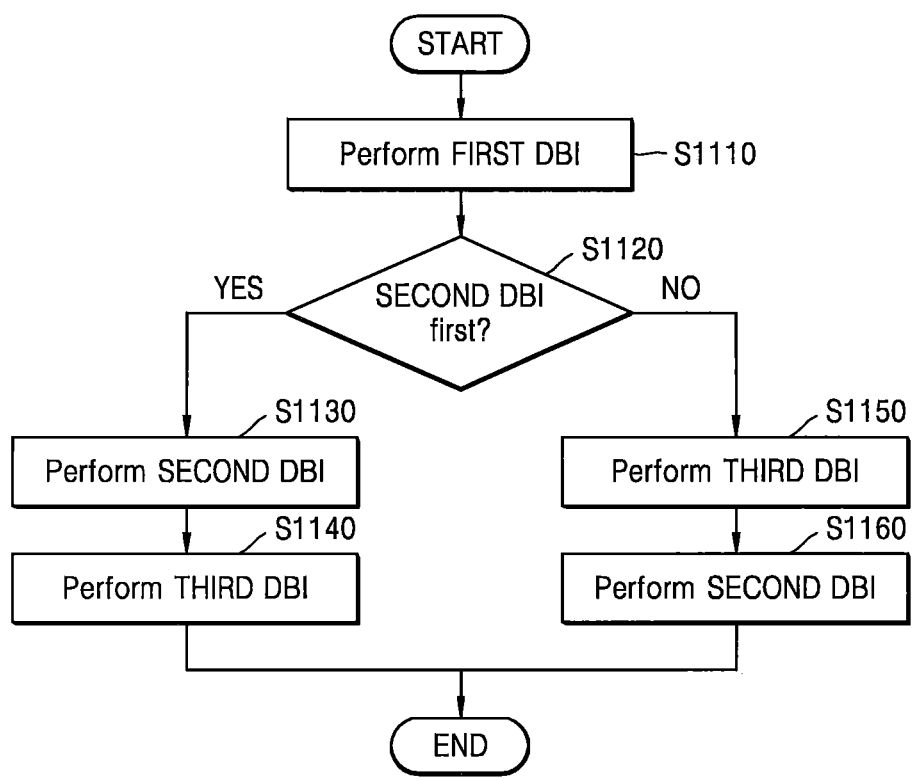
FIG. 11 is a flowchart of the methods of performing multiple DBI of FIGS. 9B, 9C, 10B, and 10C.

FIG. 11 is a flowchart of methods of performing the multiple DBI shown in the examples of FIGS. 9B, 9C, 10B, and 10C. The 8×8 data bit structure described in FIGS. 9A through 10C is given as an example based on multiple-bit wide data of an M×N (M=8*m, N=8*n, and m and n are natural numbers) data bit structure. FIG. 11 describes the multiple DBI applied to the M×N data bit structure.

Referring to FIG. 11, in operation S1110, the first DBI for determining whether or not to perform data inversion on all of the data bits included in the M×N data bit structure may be performed. In the first DBI, for example, when the number of data bits of binary 1 from among all of the data bits included in the M×N data bit structure is greater than M×N/2, which is half of M×N data bits, all of the data bits included in the M×N data bit structure may be inverted. When the number of data bits of binary 1 is not greater than M×N/2, inversion may not be performed in the first DBI.

In operation S1120, it may be decided whether to perform the second DBI or the third DBI after the first DBI. Operation S1120 may be performed by the decision unit 171 (FIG. 1) in the inversion logic unit 170 (FIG. 1).

For example, the decision unit 171 may pre-calculate the minimum number of data transitions when the second DBI and the third DBI are sequentially performed in this stated order after the first DBI, as described in FIG. 9B, and the minimum number of data transitions when the third DBI and the second DBI are sequentially performed in this stated order after the first DBI, as described in FIG. 9C. The decision unit 171 may pre-calculate that the minimum number of data transitions in the case of FIG. 9B is 11 and the minimum number of data transitions in the case of FIG. 9C is 6, and may decide to perform the third DBI after the first DBI and then to perform the second DBI, as in the case of FIG. 9C, in order to obtain the minimum number of data transitions.

The decision unit 171 may pre-calculate the minimum number of data transitions when the second DBI and the third DBI are sequentially performed in this stated order after the first DBI, as described in FIG. 10B, and the minimum number of data transitions when the third DBI and the second DBI are sequentially performed in this stated order after the first DBI, as described in FIG. 10C. The decision unit 171 may pre-calculate that the minimum number of data transitions in the case of FIG. 10B is 6 and the minimum number of data transitions in the case of FIG. 10C is 11, and may decide to perform the second DBI after the first DBI and then to perform the third DBI, as in the case of FIG. 10B, in order to obtain the minimum number of data transitions.

Based on the decision of operation S1120, when it is decided that the second DBI is to be performed after the first DBI, the processes may proceed to operation S1130, and when it is decided that the third DBI is to be performed after the first DBI, the processes may proceed to operation S1150.

Operation S1130 may be performed after operation S1110 (e.g., directly without any intervening operation), and the second DBI for determining whether or not to perform data inversion on M data bits of a corresponding column from among the data bits of first through $N^{th}$ columns grouped by M data bits in a column direction in the M×N data bit structure may be performed. In the second DBI, for example, when the number of data bits of binary 1 from among the data bits of the corresponding column is greater than M/2, which is half of the M data bits, the data bits of the corresponding column may be inverted. When the number of data bits of binary 1 is not greater than M/2, inversion may not be performed in the second DBI.

Operation S1140 may be performed after operation S1130 (e.g., directly without any intervening operation), and the third DBI for determining whether or not to perform data inversion on N data bits of a corresponding row from among the data bits of first through $M^{th}$ rows grouped by N data bits in a row direction in the M×N data bit structure may be performed. In the third DBI, for example, when the number of data bits of binary 1 from among the data bits of the corresponding row is greater than N/2, which is half of the N data bits, the data bits of the corresponding row may be inverted. When the number of data bits of binary 1 is not greater than N/2, inversion may not be performed in the third DBI.

Operation S1150 may be performed after operation S1110 (e.g., directly without any intervening operation), and the third DBI for determining whether or not to perform data inversion on N data bits of a corresponding row from among the data bits of first through $M^{th}$ rows grouped by N data bits in a row direction in the M×N data bit structure may be performed. In the third DBI, for example, when the number of data bits of binary 1 from among the data bits of the corresponding row is greater than N/2, which is half of the N data bits, the data bits of the corresponding row may be inverted. When the number of data bits of binary 1 is not greater than N/2, inversion may not be performed in the third DBI.

Operation S1160 may be performed after operation S1150 (e.g., directly without any intervening operation), and the second DBI for determining whether or not to perform data inversion on M data bits of a corresponding column from among the data bits of first through $N^{th}$ columns grouped by M data bits in a column direction in the M×N data bit structure may be performed. In the second DBI, for example, when the number of data bits of binary 1 from among the data bits of the corresponding column is greater than M/2, which is half of the M data bits, the data bits of the corresponding column may be inverted. When the number of data bits of binary 1 is not greater than M/2, inversion may not be performed in the second DBI.

Since the operation order of the second DBI and the third DBI after the first DBI in the multiple DBI may be selectively changed, with respect to the multiple-bit wide data including the M×N data bit structure, by using the method of FIG. 11, the minimum number of data transitions may further be reduced. Accordingly, a memory device performing the multiple DBI may reduce power consumption, cross talk, SSN, and ISI.

Figure 12B:
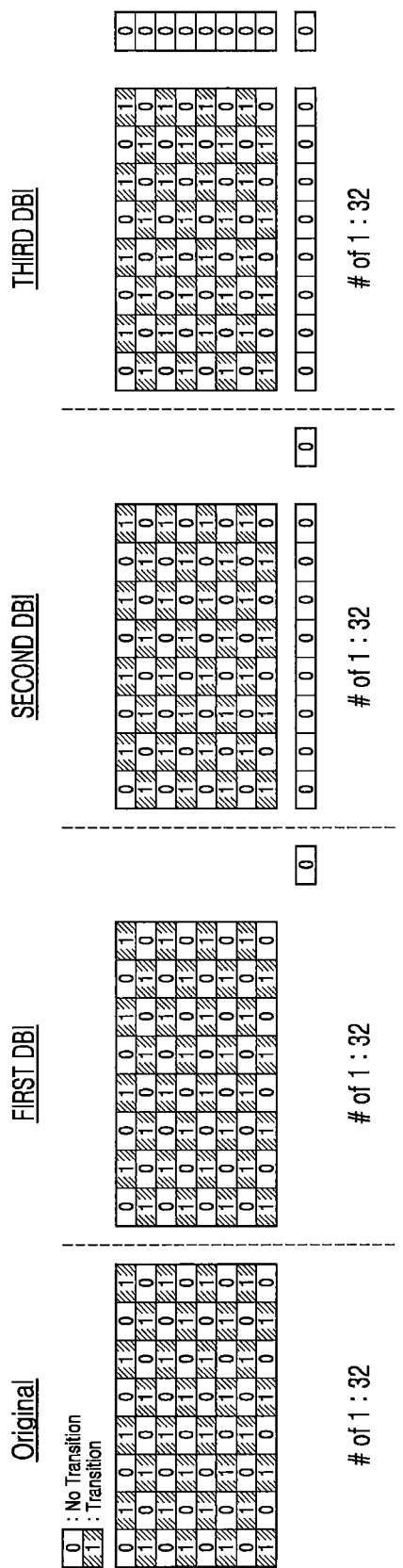

FIGS. 12A and 12B are diagrams showing examples in which the number of data transitions is minimized by using the multiple DBI of FIG. 3. In FIGS. 12A and 12B, cases in which the data value DQ[63:0] is formed of 0x55AA 55AA 55AA 55AA are described. FIG. 12A shows a result of performing the general DBI of FIG. 2, and FIG. 12B shows a result of performing the multiple DBI of FIG. 3 as a comparative example to the example of FIG. 12A.

Referring to FIG. 12A, when the data value DQ [63:0] is formed of 0x55AA 55AA 55AA 55AA, the number of data bits of binary 1 from among the data bits of the DQ pads DQ0 through DQ63 in the 8×8 data bit 1 is 32. When the general DBI of FIG. 2 is performed, the number of data bits of binary 1 in byte data is not greater than 4, and thus, the data bits of the first through seventh columns may maintain a non-inverted state in response to logic low of the DBI signals DBI0 through DBI7. Accordingly, the number of data bits of binary 1, which is obtained by performing the general DBI, may be 32.

Referring to FIG. 12B, when the data value DQ [63:0] is formed of 0x55AA 55AA 55AA 55AA, the number of data bits of binary 1 from among the data bits of the DQ pads DQ0 through DQ63 in the 8×8 data bit 1 is 32. Inversion operations of the first DBI, the second DBI, and the third DBI of the multiple DBI of FIG. 3 may not be performed. The data bits of the DQ pads DQ0 through DQ63 may not be inverted and may maintain an original state in response to logic low of the first DBI signal DBI_ALL, the second DBI signals DBI_V0 through DBI_V7, and the third DBI signals DBI_H0 through DBI_H7. Accordingly, the number of data bits of binary 1, which is obtained by performing the multiple DBI, may be 32.

In FIGS. 12A and 12B, the number of data transitions based on the multiple DBI is 32, which is the same as the number of data transitions based on the general DBI. In order to decrease the number of data transitions based on the multiple DBI, the second DBI may be forcibly performed regardless of the inversion condition that the number of data bits of binary 1 in the byte data has to be greater than 4. The multiple DBI using the forced second DBI is described in FIGS. 13A through 15B.

Figure 13A:
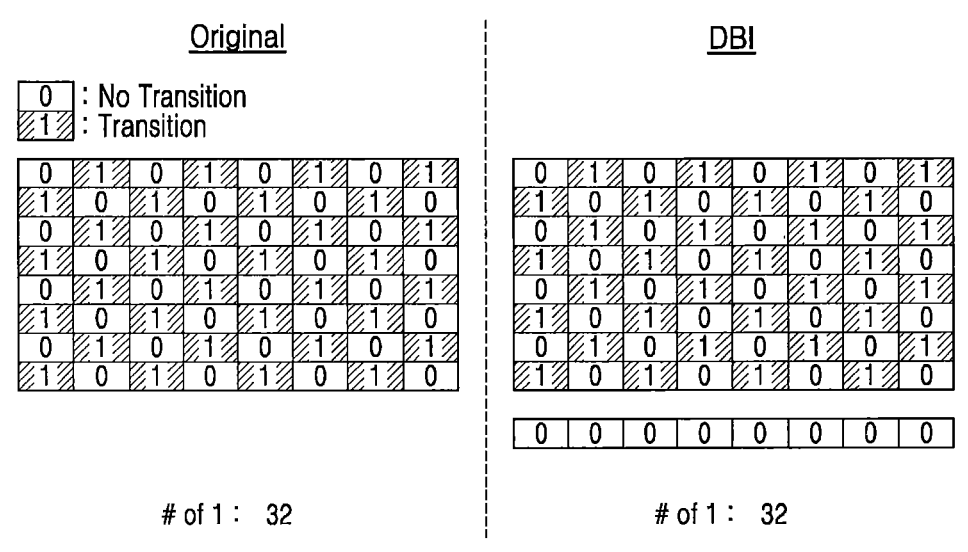
Figure 13B:
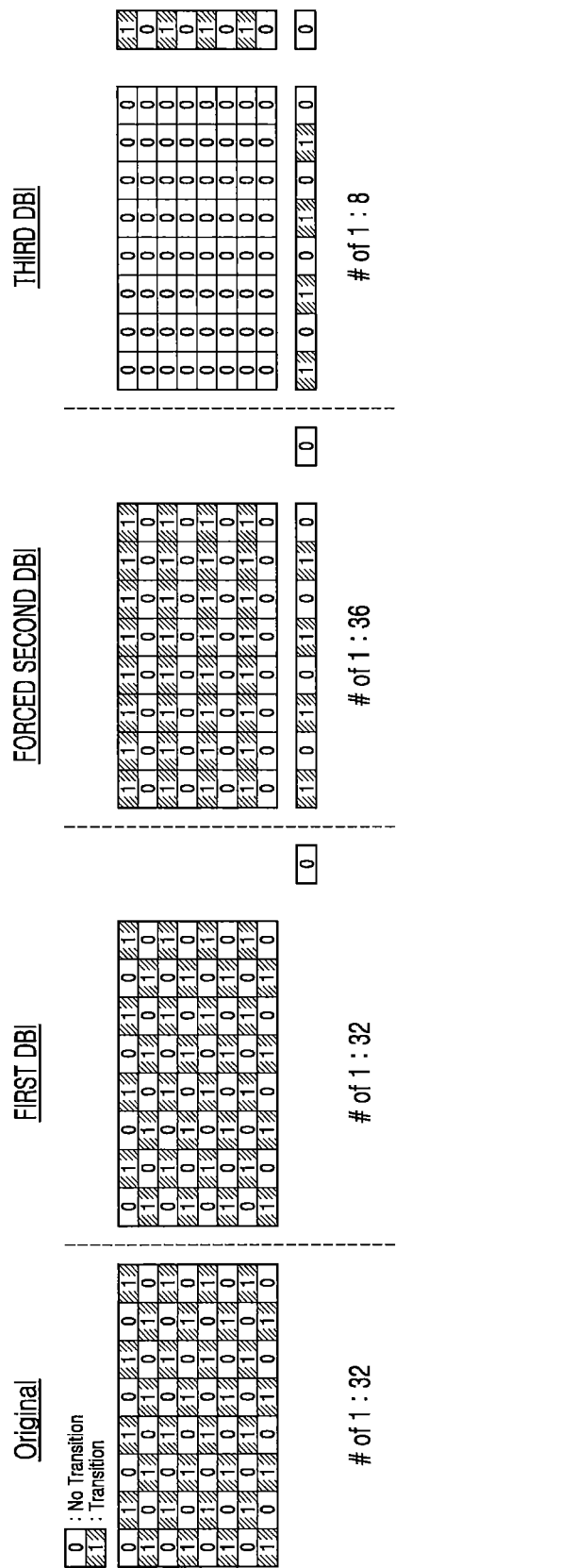

FIGS. 13A and 13B are diagrams showing examples in which the number of data transitions is minimized by using the multiple DBI of FIG. 3. In FIGS. 13A and 13B, cases in which the data value DQ[63:0] is formed of 0x55AA 55AA 55AA 55AA are described. FIG. 13A shows a result of performing the general DBI of FIG. 2, and FIG. 13B shows a result of performing the multiple DBI of FIG. 3 as a comparative example to the example of FIG. 13A.

Referring to FIG. 13A, when the data value DQ [63:0] is formed of 0x55AA 55AA 55AA 55AA, the number of data bits of binary 1, which is obtained by performing the general DBI, is 32, as described in FIG. 12A.

Referring to FIG. 13B, when the data value DQ [63:0] is formed of 0x55AA 55AA 55AA 55AA, the number of data bits of binary 1 from among the data bits of the DQ pads DQ0 through DQ63 in the 8×8 data bit 1 is 32. Inversion of the first DBI in the multiple DBI of FIG. 3 may not be performed. Then, the forced second DBI may be performed to forcibly invert data of a corresponding column in response to each of the second DBI signals DBI_V0 through DBI_V7.

According to the forced second DBI, inversion may be forcibly performed on a corresponding column to fill byte data of the first through eighth rows with binary 1. According to the forced second DBI, the second DBI may be forcibly performed even when the number of data bits of binary 1 of the first, third, fifth, and seventh columns is not greater than 4. According to the forced second DBI, the second DBI may be performed when the number of data bits of binary 1 is equal to or less than 4, so as to fill the byte data of the first through eighth rows with binary 1. The forced second DBI may invert data of the first, third, fifth, and seventh columns in response to logic high of the second DBI signals DBI_V0, DBI_V2, DBI_V4, and DBI_V6.

Then, the third DBI may be performed to determine whether or not to perform data inversion on the byte data of a corresponding row and to perform the data inversion on the byte data, in response to each of the third DBI signals DBI_H0 through DBI_H7. The data of binary 1 of the first, third, fifth, and seventh rows may be inverted to data of binary 0 in response to logic high of the third DBI signals DBI_H0, DBI_H2, DBI_H4, and DBI_H6. Accordingly, the number of data bits of binary 1, which is obtained by performing the multiple DBI, may be eight, corresponding to the second DBI signals DBI_V0, DBI_V2, DBI_V4, and DBI_V6 and the third DBI signals DBI_H0, DBI_H2, DBI_H4, and DBI_H6.

As shown in FIGS. 13A and 13B, the third DBI of the multiple DBI has the effect of reducing the number of data transitions from 32, which is obtained based on the general DBI, to 8. By reducing the number of data transitions by the forced second DBI of the multiple DBI, power consumption, cross talk, SSN, and ISI may be reduced.

Figure 14A:
FIGS. 14A and 14B are diagrams for describing a method of performing multiple DBI, according to aspects of the present disclosure.
Figure 14B:
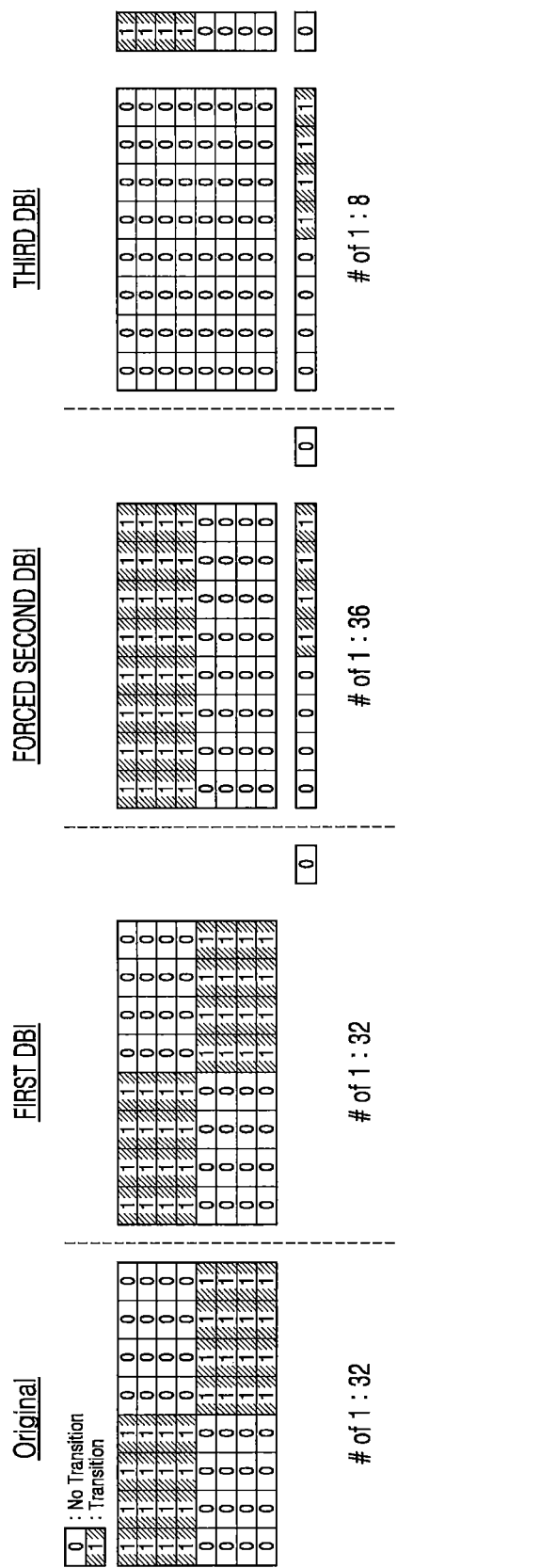

FIGS. 14A and 14B are diagrams showing examples in which the number of data transitions is minimized by using the multiple DBI of FIG. 3. In FIGS. 14A and 14B, cases in which the data value DQ[63:0] is formed of 0xF0F0 F0F0 F0F0 F0F0 are described. FIG. 14A shows a result of performing the general DBI of FIG. 2, and FIG. 14B shows a result of performing the multiple DBI of FIG. 3 as a comparative example to the example of FIG. 14A.

Referring to FIG. 14A, when the data value DQ [63:0] is formed of 0xF0F0 F0F0 F0F0 F0F0, the number of data bits of binary 1 from among the data bits of the DQ pads DQ0 through DQ63 in the 8×8 data bit structure is 32. In the general DBI of FIG. 2, the number of data bits of binary 1 in byte data is not greater than 4, and thus, the data bits of the first through seventh columns may maintain a non-inverted state in response to logic low of the DBI signals DBI_0 through DBI_7. Accordingly, the number of data bits of binary 1, which is obtained by performing the general DBI, may be 32.

Referring to FIG. 14B, when the data value DQ [63:0] is formed of 0xF0F0 F0F0 F0F0 F0F0, the number of data bits of binary 1 from among the data bits of the DQ pads DQ0 through DQ63 in the 8×8 data bit structure is 32. Inversion of the first DBI in the multiple DBI of FIG. 3 may not be performed. Then, the forced second DBI may be performed to forcibly invert data of a corresponding column in response to each of the second DBI signals DBI_V0 through DBI_V7. The data of the fifth, sixth, seventh, and eighth columns may be inverted in response to logic high of the second DBI signals DBI_V4, DBI_V5, DBI_V6, and DBI_V6. Then, the third DBI may be performed to determine whether or not to perform data inversion on the byte data of a corresponding row and to perform the data inversion on the byte data, in response to each of the third DBI signals DBI_H0 through DBI_H7. The data of binary 1 of the first, second, third, and fourth rows may be inverted to data of binary 0 in response to logic high of the third DBI signals DBI_H0, DBI_H1, DBI_H2, and DBI_H3. Accordingly, the number of data bits of binary 1, which is obtained by performing the multiple DBI, may be eight, corresponding to the second DBI signals DBI_V4, DBI_V5, DBI_V6, and DBI_V7 and the third DBI signals DBI_H0, DBI_H1, DBI_H2, and DBI_H3.

As shown in FIGS. 14A and 14B, the third DBI of the multiple DBI has the effect of reducing the number of data transitions from 32, which is obtained based on the general DBI, to 8. By reducing the number of data transitions by the forced second DBI of the multiple DBI, power consumption, cross talk, SSN, and ISI may be reduced.

Figure 15A:
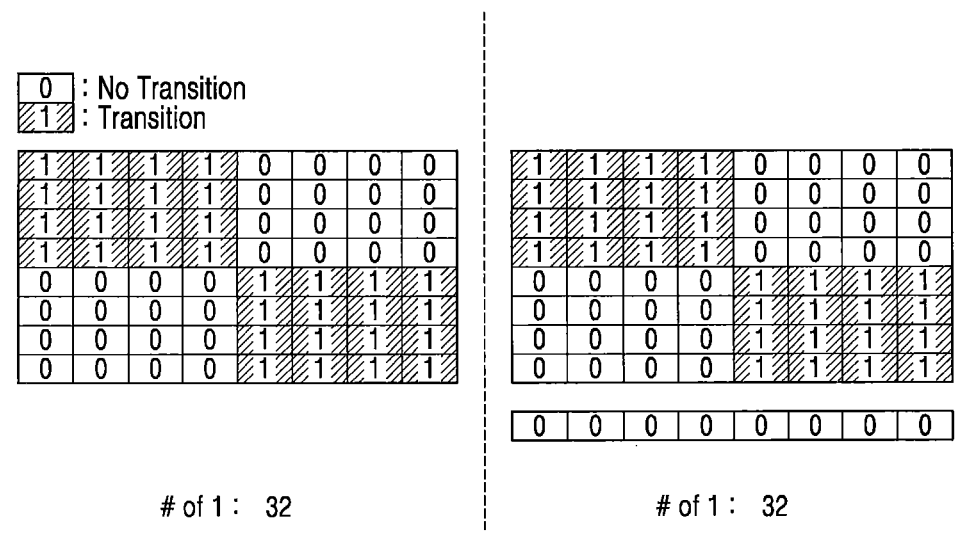
Figure 15B:
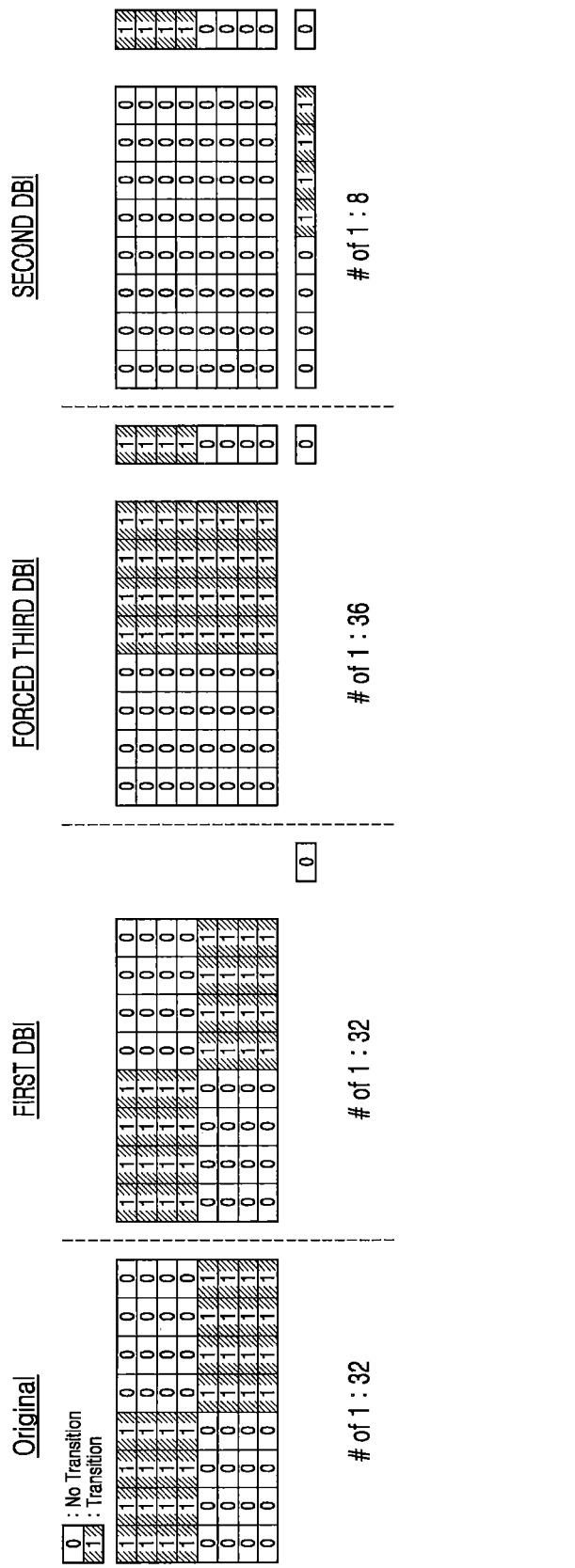

FIGS. 15A and 15B are diagrams showing examples in which the number of data transitions is minimized by using the multiple DBI of FIG. 3. In FIGS. 15 and 15B, cases in which the data value DQ[63:0] is formed of 0xF0F0 F0F0 F0F0 F0F0 are described. FIG. 15A shows a result of performing the general DBI of FIG. 2, and FIG. 15B shows a result of performing the multiple DBI of FIG. 3 as a comparative example to the example of FIG. 15A.

Referring to FIG. 15A, when the data value DQ [63:0] is formed of 0xF0F0 F0F0 F0F0 F0F0, as the case of FIG. 14A, the number of data bits, which is obtained by performing the general DBI, may be 32.

Referring to FIG. 15B, when the data value DQ [63:0] is formed of 0xF0F0 F0F0 F0F0 F0F0, the number of data bits of binary 1 from among the data bits of the DQ pads DQ0 through DQ63 in the 8×8 data bit structure is 32. Inversion of the first DBI in the multiple DBI of FIG. 3 may not be performed. Then, forced third DBI may be performed to forcibly perform data inversion on a corresponding column in response to each of the third DBI signals DBI_H0 through DBI_H7.

According to the forced third DBI, inversion may be forcibly performed on a corresponding row to fill byte data of the first through eighth columns with binary 1. According to the forced third DBI, the third DBI may be forcibly performed even when the number of data bits of binary 1 of the first through fourth rows is not greater than 4. According to the forced third DBI, the third DBI may be performed when the number of data bits of binary 1 is equal to or less than 4, so as to fill the byte data of the first through eighth columns with binary 1. The forced third DBI may invert data of the first, second, third, and fourth rows in response to logic high of the third DBI signals DBI_H0, DBI_H1, DBI_H2, and DBI_H3.

Then, the second DBI may be performed to determine whether or not to perform data inversion on the byte data of a corresponding column and to perform the data inversion on the byte data, in response to each of the second DBI signals DBI_V0 through DBI_V7. The data of binary 1 of the fifth, sixth, seventh, and eighth columns may be inverted to data of binary 0 in response to logic high of the second DBI signals DBI_V4, DBI_V5, DBI_V6, and DBI_V7. Accordingly, the number of data bits of binary 1, which is obtained by performing the multiple DBI, may be eight, corresponding to the third DBI signals DBI_H0, DBI_H1, DBI_H2, and DBI_H3 and the second DBI signals DBI_V4, DBI_V5, DBI_V6, and DBI_V7.

As shown in FIGS. 15A and 15B, the third DBI of the multiple DBI has the effect of reducing the number of data transitions from 32, which is obtained based on the general DBI, to 8. By reducing the number of data transitions by the forced third DBI of the multiple DBI, power consumption, cross talk, SSN, and ISI may be reduced.

Figure 16:
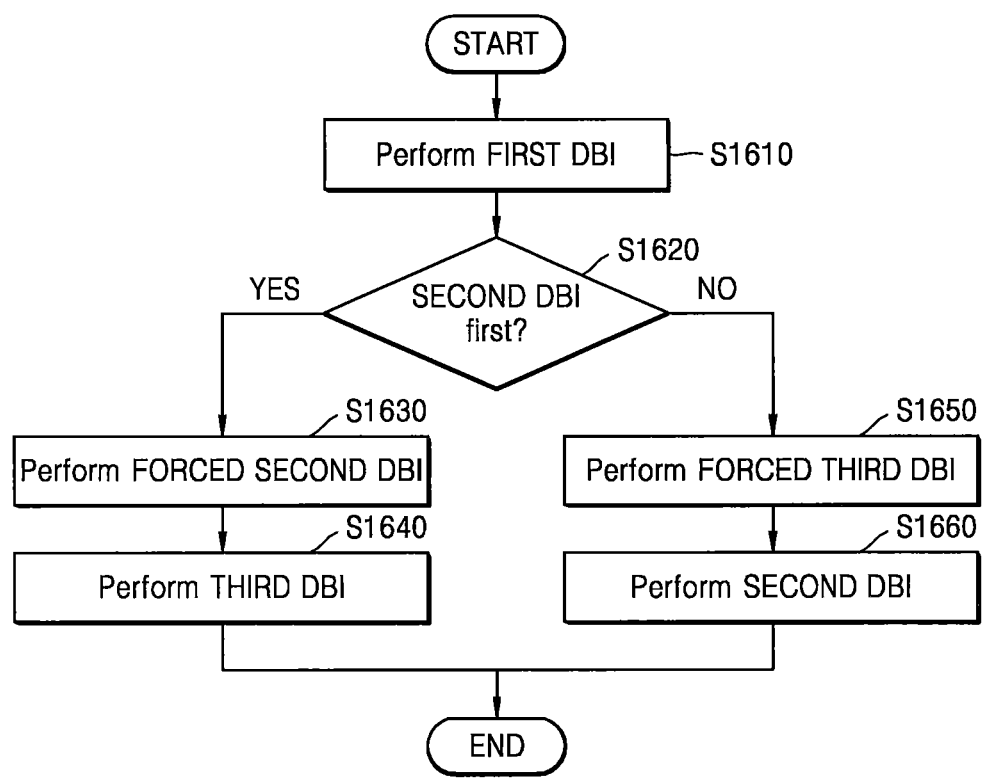
FIG. 16 is a flowchart of the methods of performing multiple DBI of FIGS. 13B, 14B, and 15B.

FIG. 16 is a flowchart of methods of performing the multiple DBI, shown in the examples of FIGS. 13B, 14B, and 15B. The 8×8 data bit structure described in FIGS. 13A through 15B is given as an example based on multiple-bit wide data of an M×N (M=8*m, N=8*n, and m and n are natural numbers) data bit structure. FIG. 16 describes the multiple DBI applied to the M×N data bit structure.

Referring to FIG. 16, in operation S1610, the first DBI for determining whether or not to perform data inversion on all of the data bits included in the M×N data bit structure may be performed. In the first DBI, for example, when the number of data bits of binary 1 from among all of the data bits included in the M×N data bit structure is greater than M×N/2, which is half of M×N data bits, all of the data bits included in the M×N data bit structure may be inverted. When the number of data bits of binary 1 is not greater than M×N/2, inversion may not be performed in the first DBI.

In operation S1620, it may be decided whether to perform the forced second DBI or the forced third DBI after the first DBI. Operation S1120 may be performed by the decision unit 171 (FIG. 1) in the inversion logic unit 170 (FIG. 1).

Based on the decision of operation S1620, when it is decided that the forced second DBI is to be performed after the first DBI, the processes may proceed to operation S1630, and when it is decided that the third DBI is to be performed after the first DBI, the processes may proceed to operation S1650.

Operation S1630 may be performed after operation S1610 (e.g., directly without any intervening operation), and the forced second DBI for determining whether or not to perform data inversion on M data bits of a corresponding column from among the data bits of first through $N^{th}$ columns grouped by M data bits in a column direction in the M×N data bit structure may be performed. According to the forced second DBI, the second DBI may be performed, for example, when the number of data bits of binary 1 from among the data bits of the corresponding column is equal to or less than M/2, which is half of the M data bits, so that byte data of the first through eighth rows is filled with binary 1.

Operation S1640 may be performed after operation S1630 (e.g., directly without any intervening operation), and the third DBI for determining whether or not to perform data inversion on N data bits of a corresponding row from among the data bits of first through $M^{th}$ rows grouped by N data bits in a row direction in the M×N data bit structure may be performed. In the third DBI, the byte data of the first through eighth rows, which is filled with binary 1 by the forced second DBI, which is performed before the third DBI, may be inverted, so as to further reduce the number of data transitions.

Operation S1650 may be performed after operation S1610 (e.g., directly without any intervening operation), and the forced third DBI for determining whether or not to perform data inversion on N data bits of a corresponding row from among the data bits of first through $M^{th}$ rows grouped by N data bits in a row direction in the M×N data bit structure may be performed. According to the third DBI, the third DBI may be performed, for example, when the number of data bits of binary 1 from among the data bits of the corresponding row is equal to or less than N/2, which is half of the N data bits, so that byte data of the first through eighth columns is filled with binary 1.

Operation S1660 may be performed after (following) operation S1650 (e.g., directly without any intervening operation), and the second DBI for determining whether or not to perform data inversion on M data bits of a corresponding column from among the data bits of first through $N^{th}$ columns grouped by M data bits in a column direction in the M×N data bit structure may be performed. In the second DBI, the byte data of the first through eighth columns, which is filled with binary 1 by the forced third DBI, which is performed before the second DBI, may be inverted, so as to further reduce the number of data transitions.

Since the operation order of the forced second DBI and the forced third DBI after the first DBI in the multiple DBI may be selectively changed, with respect to the multiple-bit wide data including the M×N data bit structure, the minimum number of data transitions may further be reduced.

Accordingly, a memory device performing the multiple DBI may reduce power consumption, cross talk, SSN, and ISI.

Figure 17A:
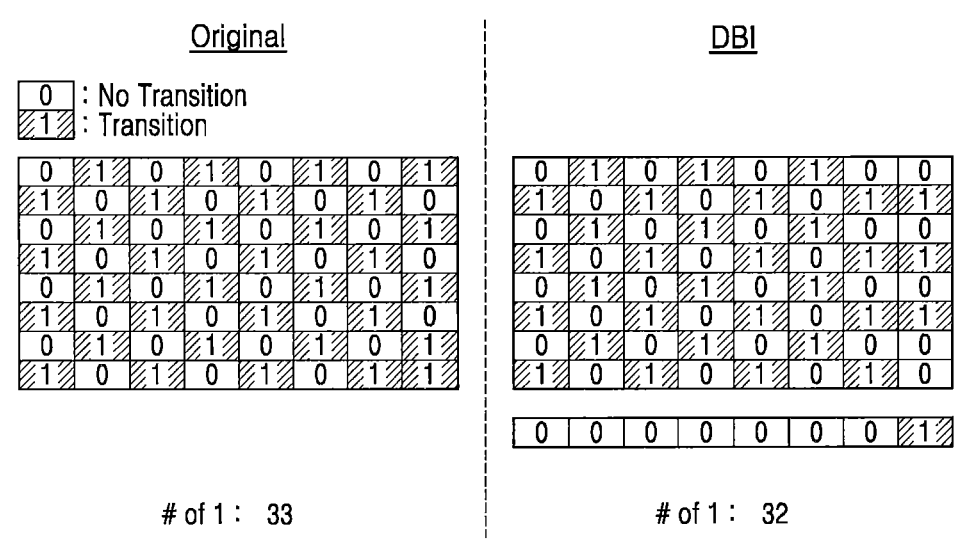
Figure 17B:
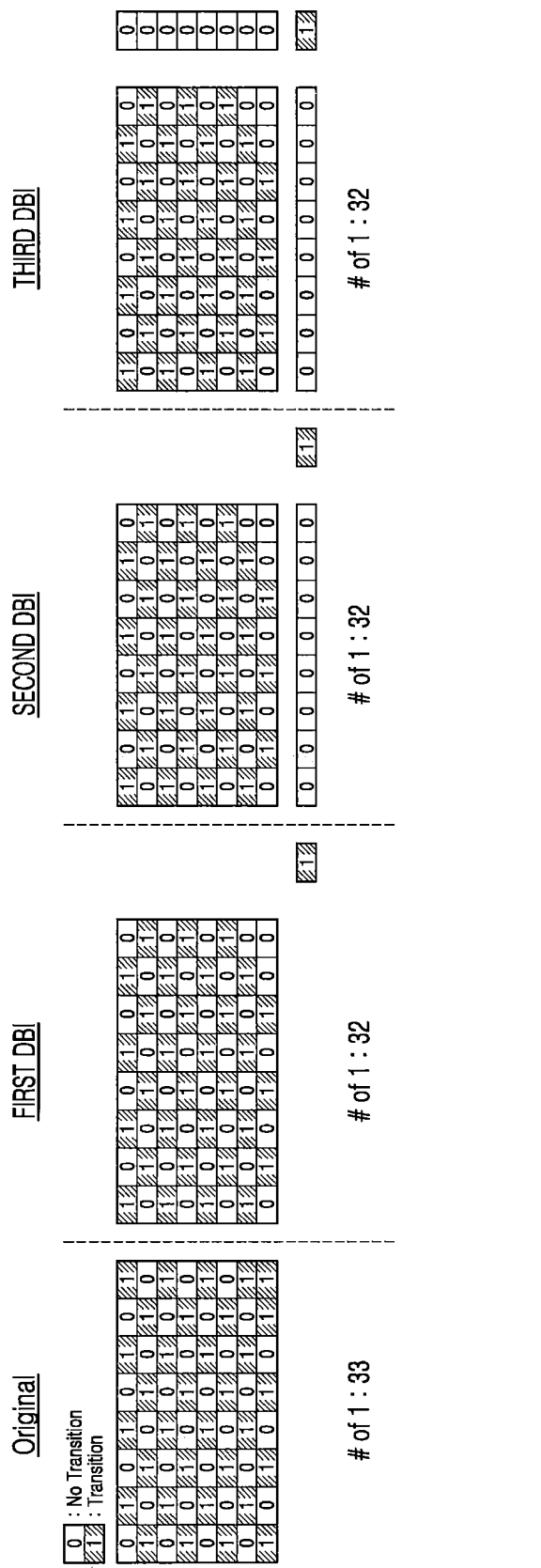

FIGS. 17A and 17B are diagrams showing examples in which the number of data transitions is minimized by using the multiple DBI of FIG. 3. In FIGS. 17A and 17B, cases in which the data value DQ[63:0] is formed of 0x55AA 55AA 55AA 55AB are described. FIG. 17A shows a result of performing the general DBI of FIG. 2, and FIG. 17B shows a result of performing the multiple DBI of FIG. 3 as a comparative example to the example of FIG. 17A.

Referring to FIG. 17A, when the data value DQ [63:0] is formed of 0x55AA 55AA 55AA 55AB, the number of data bits of binary 1 from among the data bits of the DQ pads DQ0 through DQ63 in the 8×8 data bit structure is 33. In the general DBI of FIG. 2, the number of data bits of binary 1 in byte data is greater than 4, and thus, the data bits of the eighth column may be inverted in response to logic high of the DBI signal DBI_7. Accordingly, the number of data bits of binary 1, which is obtained by performing the general DBI, may be 32.

Referring to FIG. 17B, when the data value DQ [63:0] is formed of 0x55AA 55AA 55AA 55AB, the number of data bits of binary 1 from among the data bits of the DQ pads DQ0 through DQ63 in the 8×8 data bit structure is 33. The first DBI in the multiple DBI of FIG. 3 may be performed to invert all of the data bits of the DQ pads DQ0 through DQ63 in response to logic high of the first DBI signal DBI_ALL. Here, it may be set such that the first DBI is performed when the number of data bits of binary 1 is 33, which is greater than 32. Then, inversion operations of the second DBI and the third DBI may not be performed. Accordingly, the number of data bits of binary 1, which is obtained by performing the multiple DBI, may be 32.

Figure 18A:
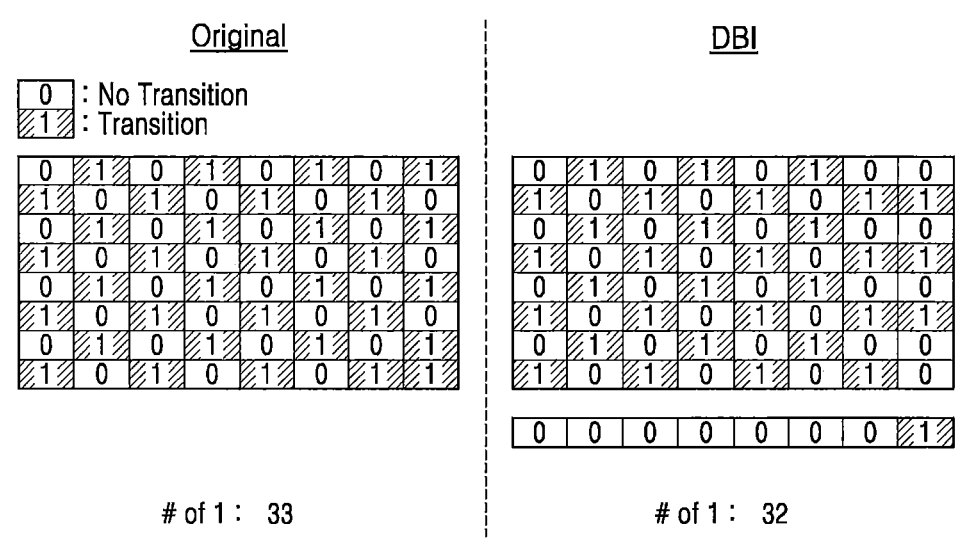
Figure 18B:
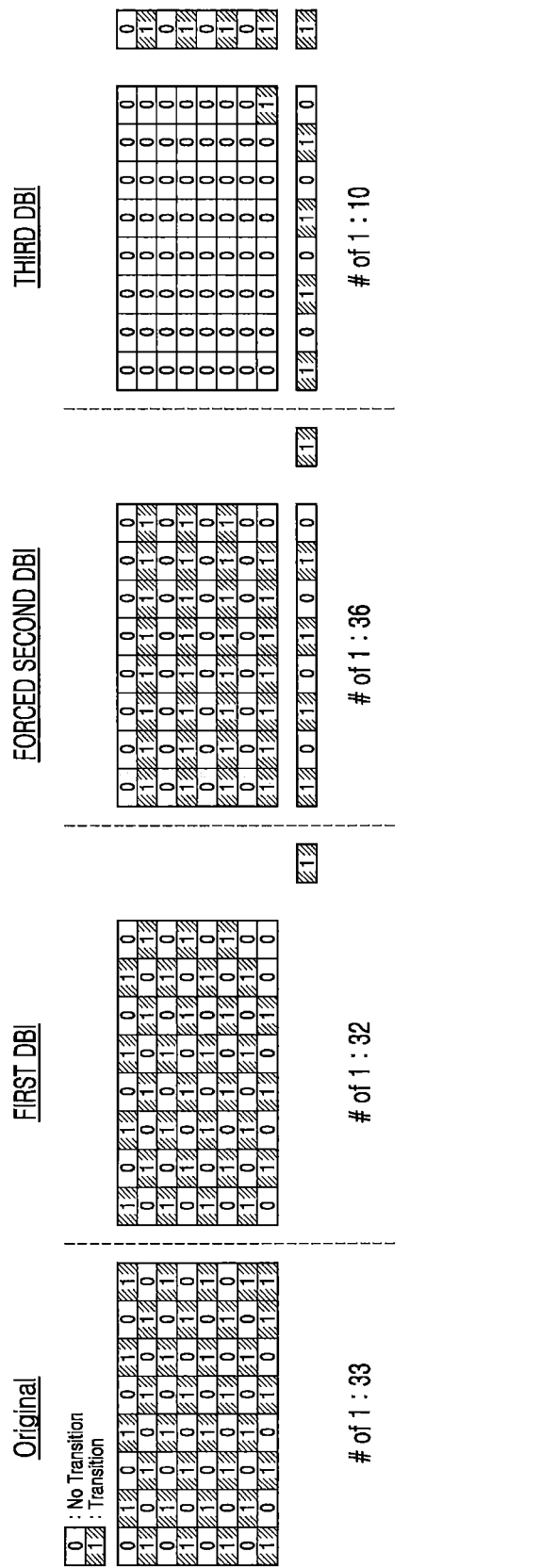

FIGS. 18A and 18B are diagrams showing examples in which the number of data transitions is minimized by using the multiple DBI of FIG. 3. In FIGS. 18A and 18B, cases in which the data value DQ[63:0] is formed of 0x55AA 55AA 55AA 55AB are described. FIG. 18A shows a result of performing the general DBI of FIG. 2, and FIG. 18B shows a result of performing the multiple DBI of FIG. 3 as a comparative example to the example of FIG. 18A.

Referring to FIG. 18A, when the data value DQ [63:0] is formed of 0x55AA 55AA 55AA 55AB, as the case of FIG. 17A, the number of data bits of binary 1, which is obtained by performing the general DBI, may be 32.

Referring to FIG. 18B, when the data value DQ [63:0] is formed of 0x55AA 55AA 55AA 55AB, the number of data bits of binary 1 from among the data bits of the DQ pads DQ0 through DQ63 in the 8×8 data bit structure is 33. The first DBI in the multiple DBI of FIG. 3 may be set to be performed when the number of data bits of binary 1 is 33, which is greater than 32. The first DBI may be performed to invert all of the data bits of the DQ pads DQ0 through DQ63 in response to logic high of the first DBI signal DBI_ALL. Then, the forced second DBI may be performed to forcibly invert data of a corresponding column in response to each of the second DBI signals DBI through DBI_V7. The data of the first, third, fifth, and seventh columns may be inverted in response to logic high of the second DBI signals DBI_V0, DBI_V2, DBI_V4, and DBI_V6. Then, the third DBI may be performed to determine whether or not to perform data inversion on byte data of a corresponding row and to perform the data inversion on the byte data of the corresponding row, in response to each of the third DBI signals DBI_H0 through DBI The data of binary 1 of the second, fourth, sixth, and eighth rows may be inverted to data of binary 0, in response to logic high of the third DBI signals DBI_H1, DBI_H3, DBI_H5, and DBI_H7. Accordingly, the number of data bits of binary 1, which is obtained by performing the multiple DBI, may be 10, corresponding to the DBI signals including the second DBI signals DBI_V0, DBI_V2, DBI_V4, and DBI_V6, and the third DBI signals DBI_H1, DBI_H3, DBI_H5, and DBI_H7.

Figure 19A:

FIGS. 19A and 19B are diagrams showing examples in which the number of data transitions is minimized by using the multiple DBI of FIG. 3. In FIGS. 19A and 19B, cases in which the data value DQ[63:0] is formed of 0x55AA 55AA 55AA 55AB are described. FIG. 19A shows a result of performing the general DBI of FIG. 2, and FIG. 19B shows a result of performing the multiple DBI of FIG. 3 as a comparative example to the example of FIG. 19A.

Referring to FIG. 19A, when the data value DQ [63:0] is formed of 0x55AA 55AA 55AA 55AB, the number of data bits of binary 1 from among the data bits of the DQ pads DQ0 through DQ63 in the 8×8 data bit structure is 33. In the general DBI of FIG. 2, the number of data bits of binary 1 in byte data is greater than 4, and thus, the data bits of the eighth column may be inverted in response to logic high of the DBI signal DBI_7. Accordingly, the number of data bits of binary 1, which is obtained by performing the general DBI, may be 32.

Referring to FIG. 19B, when the data value DQ [63:0] is formed of 0x55AA 55AA 55AA 55AB, the number of data bits of binary 1 from among the data bits of the DQ pads DQ0 through DQ63 in the 8×8 data bit structure is 33. The first DBI in the multiple DBI of FIG. 3 may be set to be performed when the number of data bits of binary 1 is 34, which is greater than 32. Inversion of the first DBI may not be performed. Then, the second DBI may be performed to invert data of a corresponding column in response to each of the second DBI signals DBI_V0 through DBI_V7. The data of the eighth column may be inverted in response to logic high of the second DBI signal DBI_V7. Then, the third DBI may be performed to determine whether or not to perform data inversion on byte data of a corresponding row and to perform the data inversion on the byte data of the corresponding row, in response to each of the third DBI signals DBI_H0 through DBI_H7. The data of the second, fourth, and sixth rows may be inverted in response to logic high of the third DBI signals DBI_H1, DBI and DBI_H5. Accordingly, the number of data bits of binary 1, which is obtained by performing the multiple DBI, may be 29.

Figure 20A:
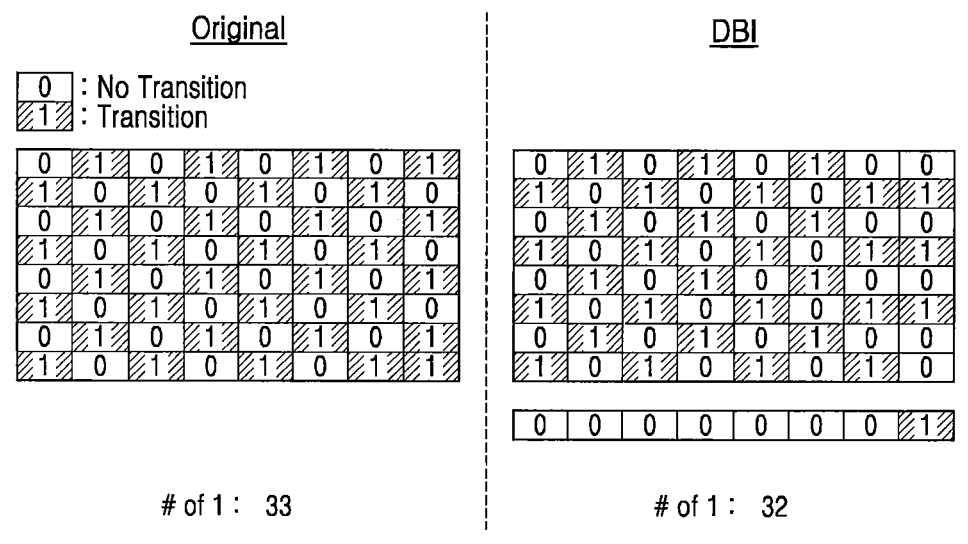
Figure 20B:
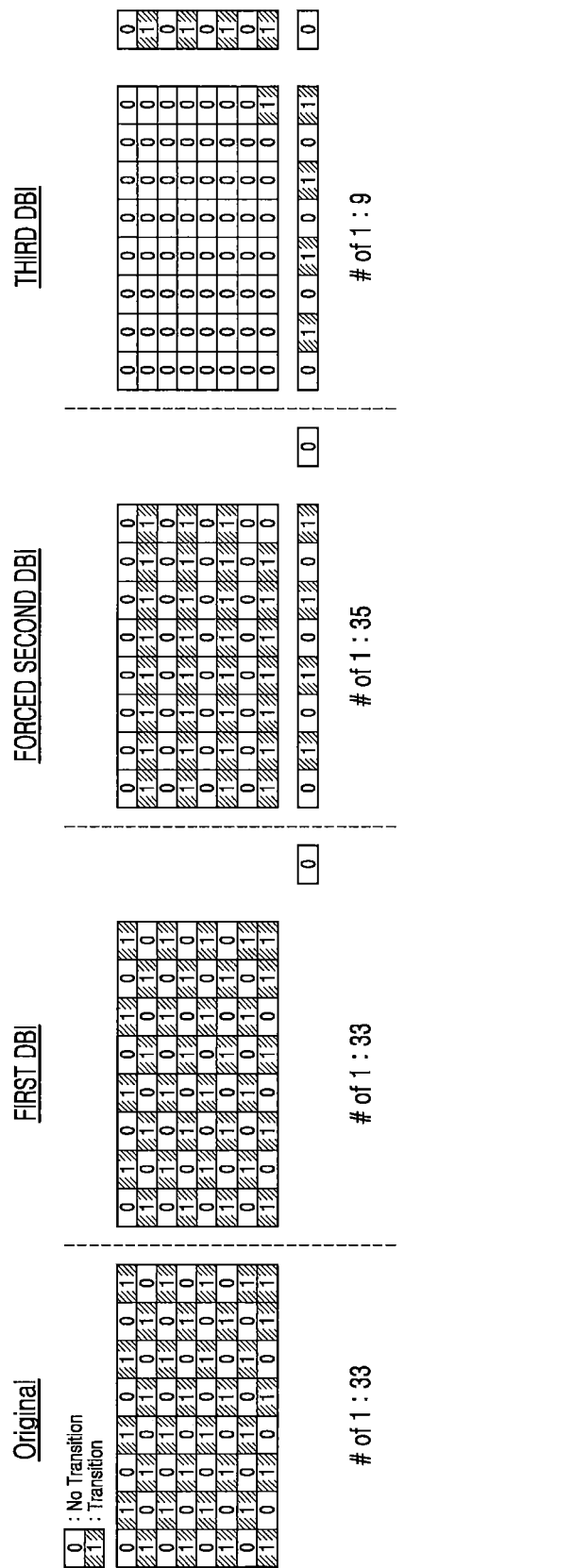

FIGS. 20A and 20B are diagrams showing examples in which the number of data transitions is minimized by using the multiple DBI of FIG. 3. In FIGS. 20A and 20B, cases in which the data value DQ[63:0] is formed of 0x55AA 55AA 55AA 55AB are described. FIG. 20A shows a result of performing the general DBI of FIG. 2, and FIG. 20B shows a result of performing the multiple DBI of FIG. 3 as a comparative example to the example of FIG. 20A.

Referring to FIG. 20A, when the data value DQ [63:0] is formed of 0x55AA 55AA 55AA 55AB, as the case of FIG. 19A, the number of data bits of binary 1, which is obtained by performing the general DBI, may be 32.

Referring to FIG. 20B, when the data value DQ [63:0] is formed of 0x55AA 55AA 55AA 55AB, the number of data bits of binary 1 from among the data bits of the DQ pads DQ0 through DQ63 in the 8×8 data bit structure is 33. The first DBI in the multiple DBI of FIG. 3 may be set to be performed when the number of data bits of binary 1 is 34, which is greater than 32, and thus, inversion of the first DBI may not be performed. Then, the forced second DBI may be performed to forcibly invert data of a corresponding column in response to each of the second DBI signals DBI_V0 through DBI_V7. The data of the second, fourth, sixth, and eighth columns may be inverted in response to logic high of the second DBI signals DBI_V1, DBI_V3, DBI_V5, and DBI_V7. Then, the third DBI may be performed to determine whether or not to perform data inversion on byte data of a corresponding row and to perform the data inversion on the byte data of the corresponding row, in response to each of the third DBI signals DBI_H0 through DBI_H7. The data of binary 1 of the second, fourth, sixth, and eighth rows may be inverted to data of binary 0, in response to logic high of the third DBI signals DBI_H1, DBI_H3, DBI_H5, and DBI_H7. Accordingly, the number of data bits of binary 1, which is obtained by performing the multiple DBI, may be 9, corresponding to the DBI signals including the second DBI signals DBI_V1, DBI_V3, DBI_V5, and DBI_V7, and the third DBI signals DBI_H1, DBI_H3, DBI_H5, and DBI_H7.

As shown in FIGS. 17A through 20B, the multiple DBI has the effect of reducing the number of data transitions from 32, which is obtained based on the general DBI, to 9. By changing the condition under which the first DBI of the multiple DBI is to be performed, and performing the forced second DBI, the number of data transitions may be reduced, so that power consumption, cross talk, SSN, and ISI may be reduced.

Figure 21A:
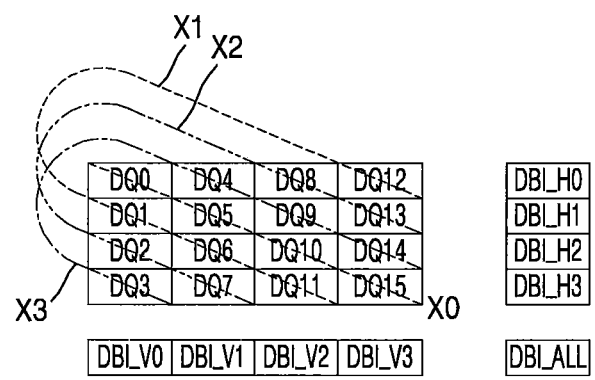
FIGS. 21A and 21B are diagrams for describing a data bit structure, to which a method of performing multiple DBI, according to the inventive concepts, may be applied.
Figure 21B:
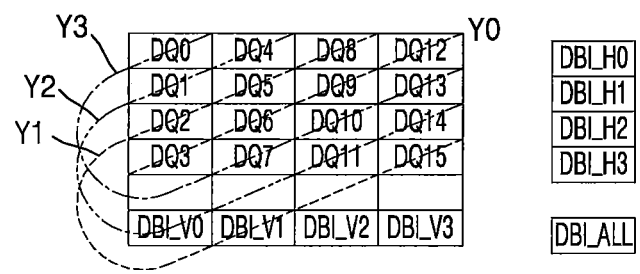

FIGS. 21A and 21B are diagrams for describing a data bit structure, to which a method of performing multiple DBI, according to the inventive concept, may be applied. FIGS. 21A and 21B show a 4×4 data bit structure and first through third DBI signals used for the multiple DBI. For understanding of the inventive concept, FIGS. 21A and 21B illustrate lines X0 through X3 and lines Y0 through Y3 as examples of data bits formed as a combination of 4 bits.

Referring to FIG. 21A, the first DBI signal DBI for determining whether or not to perform data inversion on all data bits of DQ pads DQ0 through DQ15 included in the 4×4 data bit structure, may be provided, wherein the first DBI signal DBI_ALL is used for first DBI of the multiple DBI.

The second DBI signals DBI_V0 through DBI_V3 for determining whether or not to perform data inversion on the data bits formed as the combination of 4 bits in the 4×4 data bit structure, may be provided. The second DBI signal DBI_V0 may indicate whether or not to perform data inversion on the data bits of the DQ pads DQ0, DQ5, DQ10, and DQ15 related to the line X0, the second DBI signal DBI_V1 may indicate whether or not to perform data inversion on the data bits of the DQ pads DQ1, DQ6, DQ11, and DQ12 related to the line X1, the second DBI signal DBI_V2 may indicate whether or not to perform data inversion on the data bits of the DQ pads DQ2, DQ7, DQ8, and DQ13 related to the line X2, and the second DBI signal DBI_V3 may indicate whether or not to perform data inversion on the data bits of the DQ pads DQ3, DQ4, DQ9, and DQ14 related to the line X3.

Also, the third DBI may determine whether or not to perform data inversion on byte data of a corresponding row and perform the data inversion on the byte data of the corresponding row, in response to each of the third DBI signals DBI_H0 through DBI_H3, in the 4×4 data bit structure. The third DBI signal DBI_H0 may indicate whether or not to perform data inversion on the data bits of the DQ pads DQ0, DQ4, DQ8, and DQ12 of the first row, the third DBI signal DBI_H1 may indicate whether or not to perform data inversion on the data bits of the DQ pads DQ1, DQ5, DQ9, and DQ13 of the second row, the third DBI signal DBI_H2 may indicate whether or not to perform data inversion on the data bits of the DQ pads DQ2, DQ6, DQ10, and DQ14 of the third row, and the third DBI signal DBI_H3 may indicate whether or not to perform data inversion on the data bits of the DQ pads DQ3, DQ7, DQ11, and DQ15 of the fourth row.

Referring to FIG. 21B, the first DBI signal DBI_ALL for determining whether or not to perform data inversion on all data bits of DQ pads DQ0 through DQ15 included in the 4×4 data bit structure, may be provided, wherein the first DBI signal is used for first DBI of the multiple DBI.

The second DBI signals DBI_V0 through DBI_V3 for determining whether or not to perform data inversion on the data bits formed as the combination of 4 bits in the 4×4 data bit structure, may be provided. The second DBI signal DBI_V0 may indicate whether or not to perform data inversion on the data bits of the DQ pads DQ3, DQ6, DQ9, and DQ12 related to the line Y0, the second DBI signal DBI_V1 may indicate whether or not to perform data inversion on the data bits of the DQ pads DQ2, DQ5, DQ8, and DQ15 related to the line Y1, the second DBI signal DBI_V2 may indicate whether or not to perform data inversion on the data bits of the DQ pads DQ1, DQ4, DQ11, and DQ14 related to the line Y2, and the second DBI signal DBI_V3 may indicate whether or not to perform data inversion on the data bits of the DQ pads DQ0, DQ7, DQ10, and DQ13 related to the line Y3.

Also, the third DBI may determine whether or not to perform data inversion on byte data of a corresponding row and perform the data inversion on the byte data of the corresponding row, in response to each of the third DBI signals DBI_H0 through DBI_H3, in the 4×4 data bit structure. The third DBI signal DBI_H0 may indicate whether or not to perform data inversion on the data bits of the DQ pads DQ0, DQ4, DQ8, and DQ12 of the first row, the third DBI signal DBI_H1 may indicate whether or not to perform data inversion on the data bits of the DQ pads DQ1, DQ5, DQ9, and DQ13 of the second row, the third DBI signal DBI_H2 may indicate whether or not to perform data inversion on the data bits of the DQ pads DQ2, DQ6, DQ10, and DQ14 of the third row, and the third DBI signal DBI_H3 may indicate whether or not to perform data inversion on the data bits of the DQ pads DQ3, DQ7, DQ11, and DQ15 of the fourth row.

With respect to multiple-bit wide data of the 4×4 data bit structure described in FIGS. 21A and 21B, the number of data transitions may be minimized by performing the first DBI, the second DBI, and the third DBI of the multiple DBI on the data bits formed as the combination of 4 bits. According to an embodiment, the 4 bits may be combined in a different manner, rather than the lines X0 through X3 and the lines Y0 through Y3 of the 4×4 data bit structure, and the multiple DBI including the second DBI and/or the third DBI may be performed on the 4 bits combined in the different manner.

Figure 22:
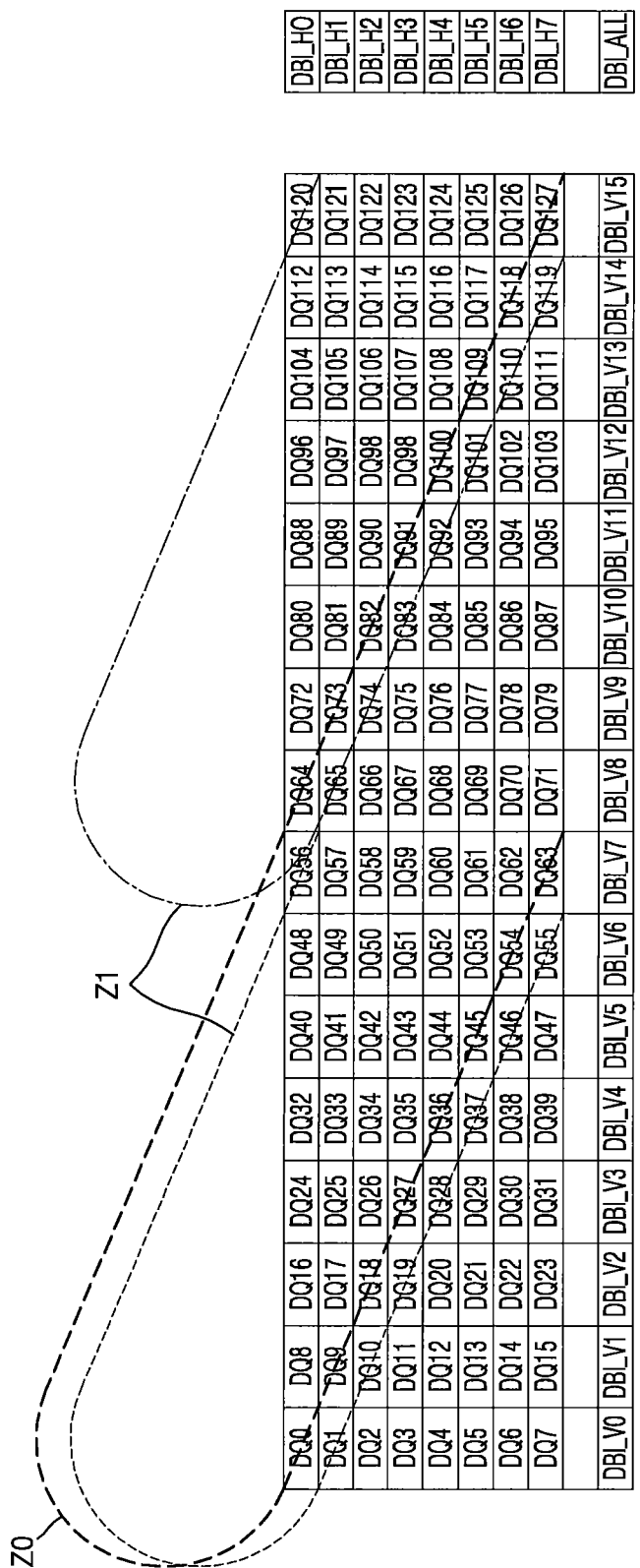
FIG. 22 is a diagram of a data bit structure, to which a method of performing multiple DBI, according to the inventive concepts, may be applied.

FIG. 22 is a diagram of a data bit structure, to which a method of performing multiple DBI, according to the inventive concepts, may be applied.

Referring to FIG. 22, first DBI signal DBI_ALL for determining whether or not to perform data inversion on all data bits of DQ pads DQ0 through DQ127 included in a 8×16 data bit structure, may be provided, wherein the first DBI signal DBI_ALL is used for first DBI of the multiple DBI.

With respect to a column direction of the 8×16 data bit structure, the data bits of the DQ pads DQ0 through DQ7 may be included in a first column, the data bits of the DQ pads DQ8 through DQ15 may be included in a second column, the data bits of the DQ pads DQ16 through DQ23 may be included in a third column, the data bits of the DQ pads DQ24 through DQ31 may be included in a fourth column, the data bits of the DQ pads DQ32 through DQ39 may be included in a fifth column, the data bits of the DQ pads DQ40 through DQ47 may be included in a sixth column, the data bits of the DQ pads DQ48 through DQ55 may be included in a seventh column, the data bits of the DQ pads DQ56 through DQ63 may be included in an eighth column, the data bits of the DQ pads DQ64 through DQ71 may be included in a ninth column, the data bits of the DQ pads DQ72 through DQ79 may be included in a tenth column, the data bits of the DQ pads DQ80 through DQ87 may be included in an eleventh column, the data bits of the DQ pads DQ88 through DQ95 may be included in a twelfth column, the data bits of the DQ pads DQ96 through DQ103 may be included in a thirteenth column, the data bits of the DQ pads DQ104 through DQ111 may be included in a fourteenth column, the data bits of the DQ pads DQ112 through DQ119 may be included in a fifteenth column, and the data bits of the DQ pads DQ120 through DQ127 may be included in a sixteenth column. Also, with respect to byte data of the first through sixteenth columns, second DBI signals DBI_V0 through DBI_V15 indicating whether or not to perform data inversion on the data bits of a corresponding column may be provided.

Third DBI signals DBI_H0 through DBI_H7 for determining whether or not to perform data inversion on the data bits formed as a combination of 16 bits in the 8×16 data structure may be provided. For understanding of the inventive concept, lines Z0 and Z1 are shown as examples of the data bits formed as the combination of 16 bits. The third DBI signal DBI_H0 may indicate whether or not to perform data inversion on the data bits of the DQ pads DQ0, DQ9, DQ18, DQ27, DQ36, DQ45, DQ54, DQ63, DQ64, DQ73, DQ82, DQ91, DQ100, DQ109, DQ118, and DQ127 related to the line Z0. The third DBI signal DBI_H1 may indicate whether or not to perform data inversion on the data bits of the DQ pads DQ1, DQ10, DQ19, DQ28, DQ37, DQ46, DQ55, DQ56, DQ65, DQ74, DQ83, DQ92, DQ101, DQ110, DQ119, and DQ120 related to the line Z1. In this way, each of the third DBI signals DBI_H2 through H7 may indicate whether or not to perform data inversion on the data bits formed as the combination of 16 bits.

With respect to multiple-bit wide data of the 8×16 data bit structure described in FIG. 22, the number of data transitions may be minimized by performing the first DBI, the second DBI, and the third DBI of the multiple DBI on the data bits formed as the combination of 16 bits. According to an embodiment, the 16 bits may be combined in a different manner, rather than the lines Z0 and Z1 of the 8×16 data bit structure, and the multiple DBI including the third DBI may be performed on the 16 bits combined in the different manner.

Figures 23A, 23B:
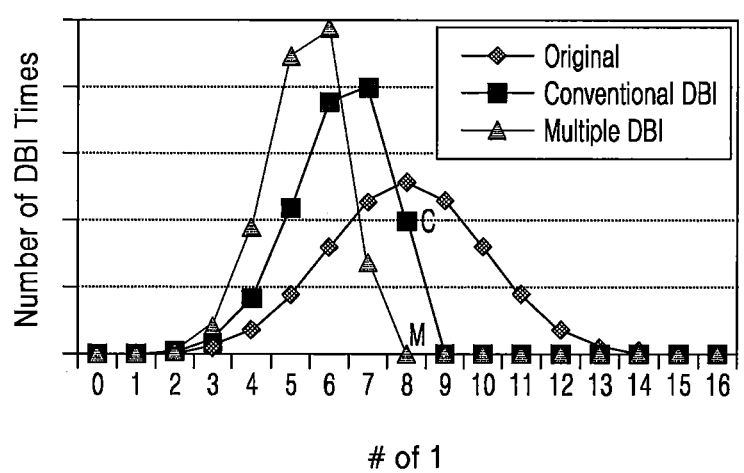
FIGS. 23A and 23B are diagrams showing an effect of multiple DBI according to aspects of the present disclosure.

FIGS. 23A and 23B are diagrams showing an effect of multiple DBI according to embodiments.

The multiple DBI may be performed on data bits included in a 4×4 data bit structure illustrated in FIG. 23A. First DBI may be performed to determine whether or not to perform data inversion on all the data bits of DQ pads DQ0 through DQ15 and perform the data inversion on all the data bits of the DQ pads DQ0 through DQ15, in response to a first DBI signal DBI_ALL. Second DBI may be performed to determine whether or not to perform data inversion on the data bits of the DQ pads DQ0 through DQ3 of a first column, the data bits of the DQ pads DQ4 through DQ7 of a second column, the data bits of the DQ pads DQ8 through DQ11 of a third column, and the data bits of the DQ pads DQ12 through DQ15 of a fourth column, and to perform the data inversion on the data bits of the DQ pads DQ0 through DQ3 of the first column, the data bits of the DQ pads DQ4 through DQ7 of the second column, the data bits of the DQ pads DQ8 through DQ11 of the third column, and the data bits of the DQ pads DQ12 through DQ15 of the fourth column, in response to second DBI signals DBI_V0 through DBI_V3. Third DBI may be performed to determine whether or not to perform data inversion on the data bits of the DQ pads DQ0, DQ4, DQ8, and DQ12 of a first row, the data bits of the DQ pads DQ1, DQ5, DQ9, and DQ13 of a second row, the data bits of the DQ pads DQ2, DQ6, DQ10, and DQ14 of a third row, and the data bits of the DQ pads DQ3, DQ7, DQ11, and DQ15 of a fourth row, and to perform the data inversion on the data bits of the DQ pads DQ0, DQ4, DQ8, and DQ12 of the first row, the data bits of the DQ pads DQ1, DQ5, DQ9, and DQ13 of the second row, the data bits of the DQ pads DQ2, DQ6, DQ10, and DQ14 of the third row, and the data bits of the DQ pads DQ3, DQ7, DQ11, and DQ15 of the fourth row, in response to third DBI signals DBI_H0 through DBI_H3.

Referring to FIG. 23B, the number of data transitions of original data, as an experimental result of simulating the 16 data bits of the 4×4 data bit structure of FIG. 23A, the number of data transitions in the general DBI of FIG. 2, and the number of data transitions in the multiple DBI of FIG. 3 may be compared. When the number of data bits of binary 1 is greater than 8, which is half of all the data bits, 16, the number of data transitions is relatively low in the general DBI and the multiple DBI. However, while the number of data transitions based on the multiple DBI (a point M) when the number of data bits of binary 1 is equal to 8, which is the half of all the data bits, 16, is substantially the same as the number of data transitions when the number of data bits of binary 1 is greater than the half of all the data bits, the number of data transitions based on the general DBI (a point C) is greater than the number of data transitions based on the multiple DBI (the point M). Based on this experimental result, it is shown that the multiple DBI has the effect of greatly reducing the number of data transitions, compared to the general DBI.

While the inventive concepts have been particularly shown and described with reference to embodiments thereof, it will be understood that various changes in form and details may be made without departing from the scope of the following claims.

What is claimed is:

1. A memory device configured to perform multiple data bus inversion (DBI), the memory device comprising:
   a channel configured to transmit multiple-bit data comprising M×N data bits, where M and N are natural numbers; and
   an inversion logic unit configured to selectively perform a first DBI operation on a first data inversion group in which the M×N data bits are grouped and configured to selectively perform a second DBI operation on second data inversion groups in which M data bits from among the M×N data bits are grouped, based on a first value of each of the M×N data bits.

2. The memory device of claim 1, wherein the inversion logic unit is further configured to selectively perform a third DBI operation on third data inversion groups in which N data bits from among the M×N data bits are grouped.

3. The memory device of claim 1, wherein the first value is binary 1 or binary 0, which indicates a data transition state of each of the M×N data bits.

4. The memory device of claim 2, wherein the inversion logic unit is configured to determine an order in which the second DBI operation and the third DBI operation are to be performed after the first DBI operation is performed, and wherein the inversion logic unit is configured to perform the multiple DBI based on the determined order.

5. The memory device of claim 1, wherein the inversion logic unit is further configured to invert the M×N data bits of the first data inversion group based on a first DBI signal, responsive to a number of data bits of the first data inversion group having the first value from among the M×N data bits of the first data inversion group being greater than M×N/2.

6. The memory device of claim 1, wherein the inversion logic unit is further configured to invert the M×N data bits of the first data inversion group based on a first DBI signal, responsive to a number of data bits of the first data inversion group having the first value from among the M×N data bits of the first data inversion group being greater than M×N/2+i, where i is a natural number that is equal to or greater than 1.

7. The memory device of claim 1, wherein the inversion logic unit is further configured to invert the M data bits of each of the second data inversion groups in which a number of data bits of the second data inversion groups having the first value from among the M data bits of the second data inversion groups is greater than M/2 based on second DBI signals respectively corresponding to the second data inversion groups.

8. The memory device of claim 1, wherein the inversion logic unit is further configured to invert the M data bits of each of the second data inversion groups in which a number of data bits of the second data inversion groups having the first value from among the M data bits of the second data inversion groups is equal to or less than M/2, based on second DBI signals respectively corresponding to the second data inversion groups.

9. The memory device of claim 2, wherein the inversion logic unit is further configured to invert the N data bits of each of the third data inversion groups in which a number of data bits of the third data inversion groups having the first value from among the N data bits of the third data inversion groups is greater than N/2, based on third DBI signals respectively corresponding to the third data inversion groups.

10. The memory device of claim 4, wherein when the third DBI operation is to be performed after the first DBI operation is performed and before the second DBI operation, the inversion logic unit is further configured to forcibly invert the N data bits of the third data inversion groups in which the number of data bits of the third data inversion groups having the first value from among the N data bits of the third data inversion groups is equal to or less than N/2, based on third DBI signals respectively corresponding to the third data inversion groups.

11. A method of performing, based on a first value of each of M×N data bits, multiple data bus inversion (DBI) on multiple-bit data comprising an M×N data bit structure, where M and N are natural numbers, the method comprising:
  forming a first data inversion group by grouping the M×N data bits of the M×N data bit structure;
  forming second data inversion groups by grouping the M×N data bit structure by M data bits in a first direction;
  determining whether to perform data inversion on the first data inversion group and performing the data inversion on the first data inversion group, in response to a first DBI signal; and
  determining whether to perform data inversion on the second data inversion groups and performing the data inversion on the second data inversion groups, in response to second DBI signals respectively corresponding to the second data inversion groups.

12. The method of claim 11, further comprising:
  forming third data inversion groups by grouping the M×N data bit structure by N data bits in a second direction; and
  determining whether to perform data inversion on the third data inversion groups and performing the data inversion on the third data inversion groups, in response to third DBI signals respectively corresponding to the third data inversion groups.

13. The method of claim 12, wherein the determining whether to perform data inversion on the second data inversion groups and the performing of the data inversion on the second data inversion groups, are initiated prior to the determining whether to perform data inversion on the third data inversion groups and the performing of the data inversion on the third data inversion groups, and after the determining whether to perform data inversion on the first data inversion group and the performing of the data inversion on the first data inversion group.

14. The method of claim 12, wherein the determining whether to perform data inversion on the third data inversion groups and the performing of the data inversion on the third data inversion groups are initiated prior to the determining whether to perform data inversion on the second data inversion groups and the performing of the data inversion on the second data inversion groups, and after the determining whether to perform data inversion on the first data inversion group and the performing of the data inversion on the first data inversion group.

15. The method of claim 11, wherein the determining whether to perform data inversion on the second data inversion groups and the performing of the data inversion on the second data inversion groups, in response to the second DBI signals respectively corresponding to the second data inversion groups, comprises:
  setting each of the second DBI signals to a value indicating that the M data bits of the corresponding second data inversion group are to be inverted, responsive to a number of data bits of the corresponding second data inversion group having the first value from among the M data bits of the corresponding second data inversion group being greater than M/2.

16. The method of claim 11, wherein the determining whether to perform data inversion on the second data inversion groups and the performing of the data inversion on the second data inversion groups, in response to the second DBI signals respectively corresponding to the second data inversion groups, comprises:
  setting each of the second DBI signals to a value indicating that the data bits of the corresponding second data inversion group are to be inverted forcibly, responsive to a number of data bits of the corresponding second data inversion group having binary of the first value from among the M data bits of the corresponding second data inversion group being equal to or less than M/2.

17. The method of claim 12, wherein the determining whether to perform data inversion on the third data inversion groups and the performing of the data inversion on the third data inversion groups, in response to the third DBI signals respectively corresponding to the third data inversion groups, comprises:

setting each of the third DBI signals to a value indicating that the N data bits of the corresponding third data inversion group are to be inverted, responsive to a number of data bits of the corresponding third data inversion group having the first value from among the N data bits of the corresponding third data inversion group being greater than N/2.

18. The method of claim 12, wherein the determining whether to perform data inversion on the third data inversion groups and the performing of the data inversion on the third data inversion groups, in response to the third DBI signals respectively corresponding to the third data inversion groups, comprises:

setting each of the third DBI signals to a value indicating that the N data bits of the corresponding third data inversion group are to be inverted forcibly, responsive to a number of data bits of the corresponding third data inversion group having the first value from among the N data bits of the corresponding third data inversion group being equal to or less than N/2.

19. A method of performing, based on a first value of each of M×N data bits, multiple data bus inversion (DBI) on multiple-bit data comprising an M×N data bit structure, wherein M and N are natural numbers, the method comprising:

forming a first data inversion group by grouping the M×N data bits;

forming second data inversion groups by assembling M data bits from among the M×N data bits in the M×N data bit structure and grouping the assembled M data bits;

determining whether to perform data inversion on the first data inversion group and performing the data inversion on the first data inversion group, in response to a first DBI signal; and determining whether to perform data inversion on the second data inversion groups and performing the data inversion on the second data inversion groups, in response to second DBI signals respectively corresponding to the second data inversion groups.

20. The method of claim 19, further comprising:

forming third data inversion groups by assembling N data bits from among the M×N data bits in the M×N data bit structure and grouping the assembled N data bits; and determining whether to perform data inversion on the third data inversion groups and performing the data inversion on the third data inversion groups, in response to third DBI signals respectively corresponding to the third data inversion groups.

* * * * *